(12) United States Patent
Nakatsuji et al.

(10) Patent No.: US 8,736,232 B2
(45) Date of Patent: May 27, 2014

(54) FULL CHARGE CAPACITY CORRECTION CIRCUIT, CHARGING SYSTEM, BATTERY PACK AND FULL CHARGE CAPACITY CORRECTION METHOD

(75) Inventors: Toshiyuki Nakatsuji, Hyogo (JP); Tsuyoshi Morimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 590 days.

(21) Appl. No.: 13/105,694

(22) Filed: May 11, 2011

(65) Prior Publication Data

US 2011/0279094 A1     Nov. 17, 2011

Related U.S. Application Data

(60) Provisional application No. 61/334,809, filed on May 14, 2010.

(51) Int. Cl.
    *H02J 7/00*            (2006.01)
(52) U.S. Cl.
    USPC .......................................... 320/132; 324/429
(58) Field of Classification Search
    USPC ....................................................... 320/132
    See application file for complete search history.

(56) References Cited

U.S. PATENT DOCUMENTS 6,495,989 B1    12/2002    Eguchi

FOREIGN PATENT DOCUMENTS

| JP | 4-115084 | 10/1992 |
|---|---|---|
| JP | 2001-057246 | 2/2001 |
| JP | 2004-257781 | 9/2004 |
| JP | 2006-177764 | 7/2006 |

OTHER PUBLICATIONS

International Search Report issued in International Patent Application No. PCT/JP2010/003088, mailed Aug. 10, 2010.

*Primary Examiner* — Edward Tso
*Assistant Examiner* — Robert Grant
(74) *Attorney, Agent, or Firm* — McDermott Will & Emery LLP

(57) ABSTRACT

A full charge capacity correction circuit including: an integrating unit that calculates an integrated current value; a capacity storing unit that stores a full charge capacity value; a first estimating unit that estimates a storage ratio, which is a ratio of a quantity of stored electricity to an actual full charge capacity, as a first storage ratio; a second estimating unit that estimates a storage ratio; a full charge capacity correction unit that estimates a new full charge capacity value, and stores the estimated new full charge capacity value; an open circuit ratio estimating unit that uses a condition in which the rechargeable battery is in an open circuit state, and estimates the storage ratio based on a terminal voltage of the rechargeable battery; and a correction control unit that uses the open circuit ratio estimating unit as the first estimating unit or the second estimating unit.

18 Claims, 14 Drawing Sheets

FIG.3A
RSOC=95%

| TEMPERATURE t / CURRENT VALUE Ic | 0°C | 20°C | 35°C | 50°C |
|---|---|---|---|---|
| 2A | V11a | V12a | V13a | V14a |
| 1A | V21a | V22a | V23a | V24a |
| 0A | V31a | V32a | V33a | V34a |
| −1A | V41a | V42a | V43a | V44a |
| −2A | V51a | V52a | V53a | V54a |

FIG.3B
RSOC=50%

| TEMPERATURE t / CURRENT VALUE Ic | 0°C | 20°C | 35°C | 50°C |
|---|---|---|---|---|
| 2A | V11b | V12b | V13b | V14b |
| 1A | V21b | V22b | V23b | V24b |
| 0A | V31b | V32b | V33b | V34b |
| −1A | V41b | V42b | V43b | V44b |
| −2A | V51b | V52b | V53b | V54b |

FIG.3C
RSOC=5.5%

| TEMPERATURE t / CURRENT VALUE Ic | 0°C | 20°C | 35°C | 50°C |
|---|---|---|---|---|
| 2A | V11c | V12c | V13c | V14c |
| 1A | V21c | V22c | V23c | V24c |
| 0A | V31c | V32c | V33c | V34c |
| −1A | V41c | V42c | V43c | V44c |
| −2A | V51c | V52c | V53c | V54c |

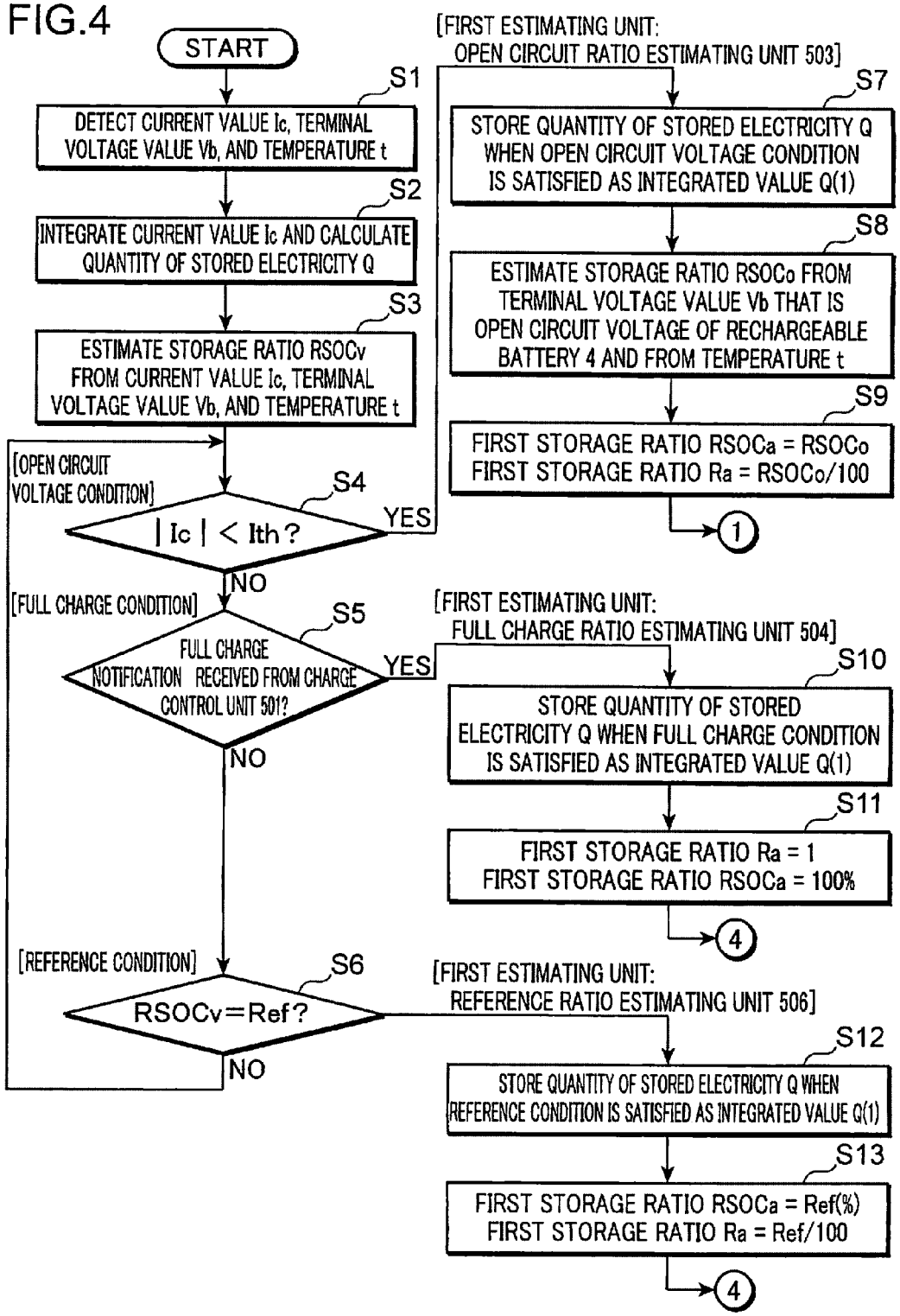

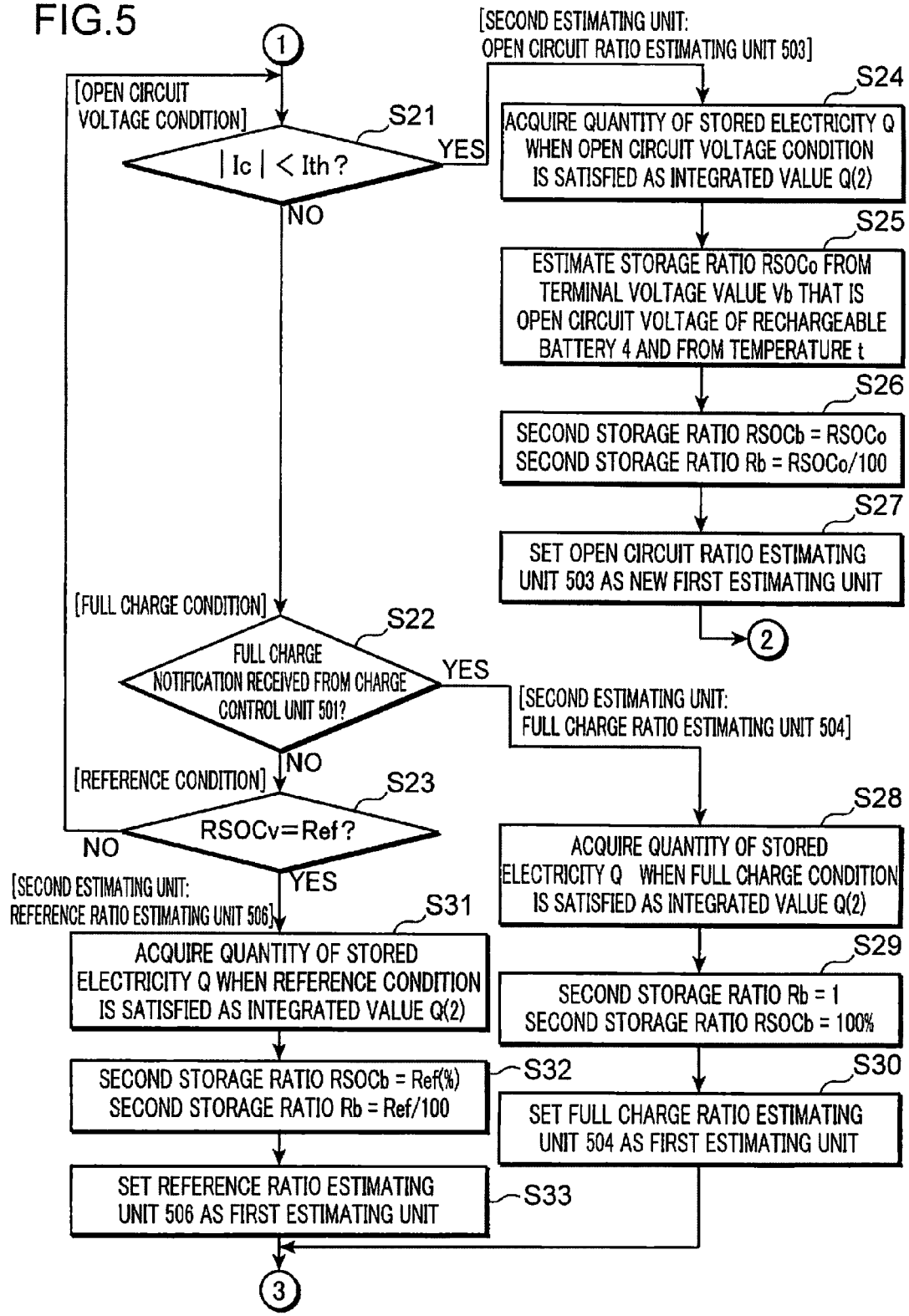

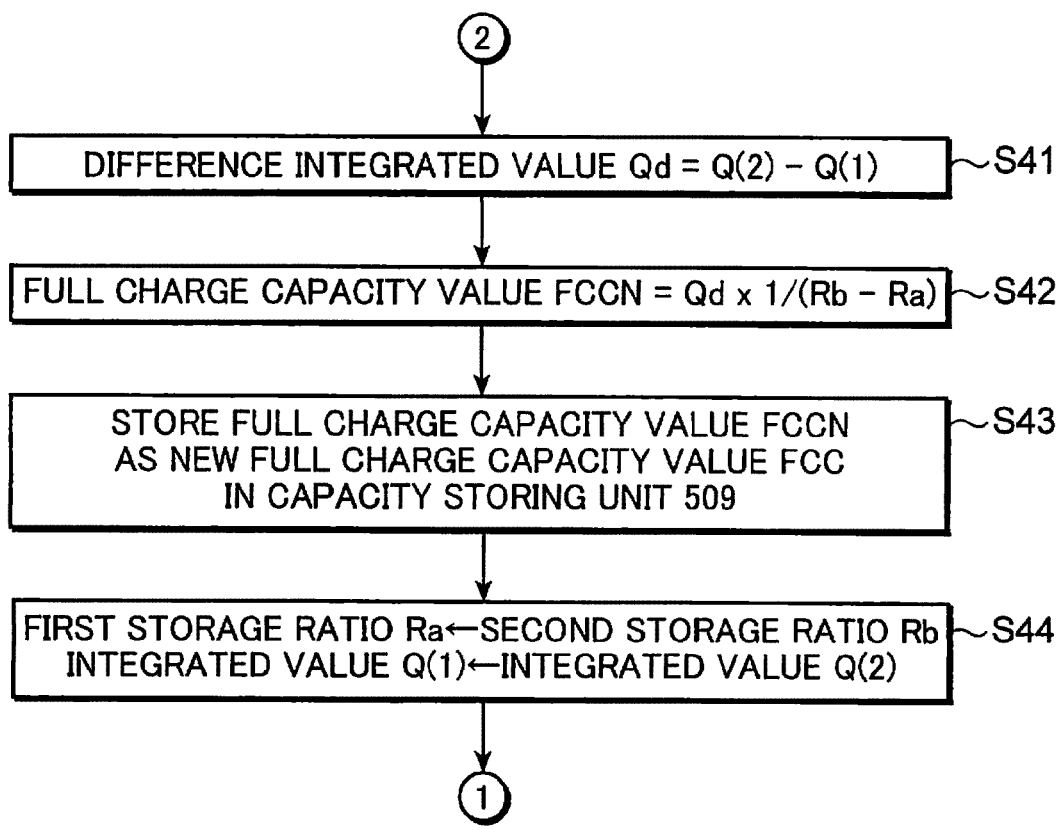

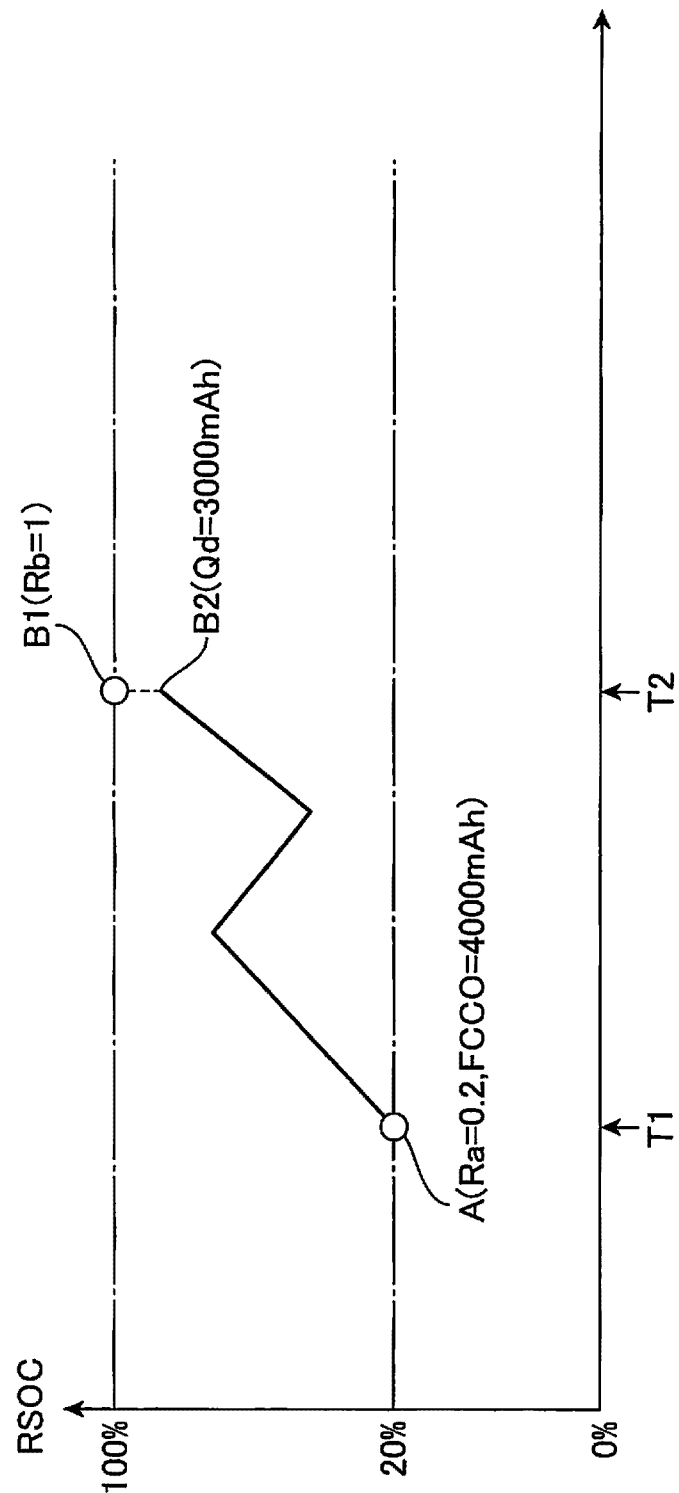

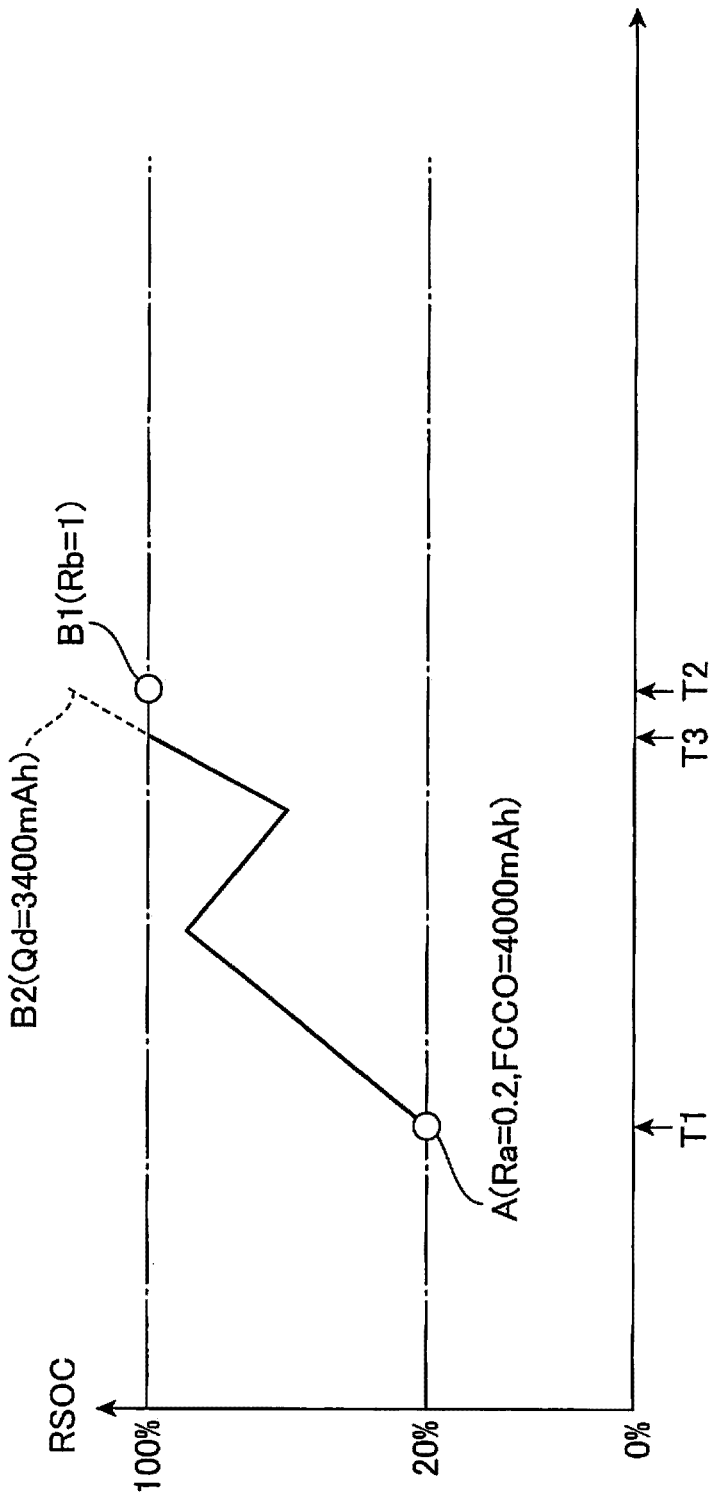

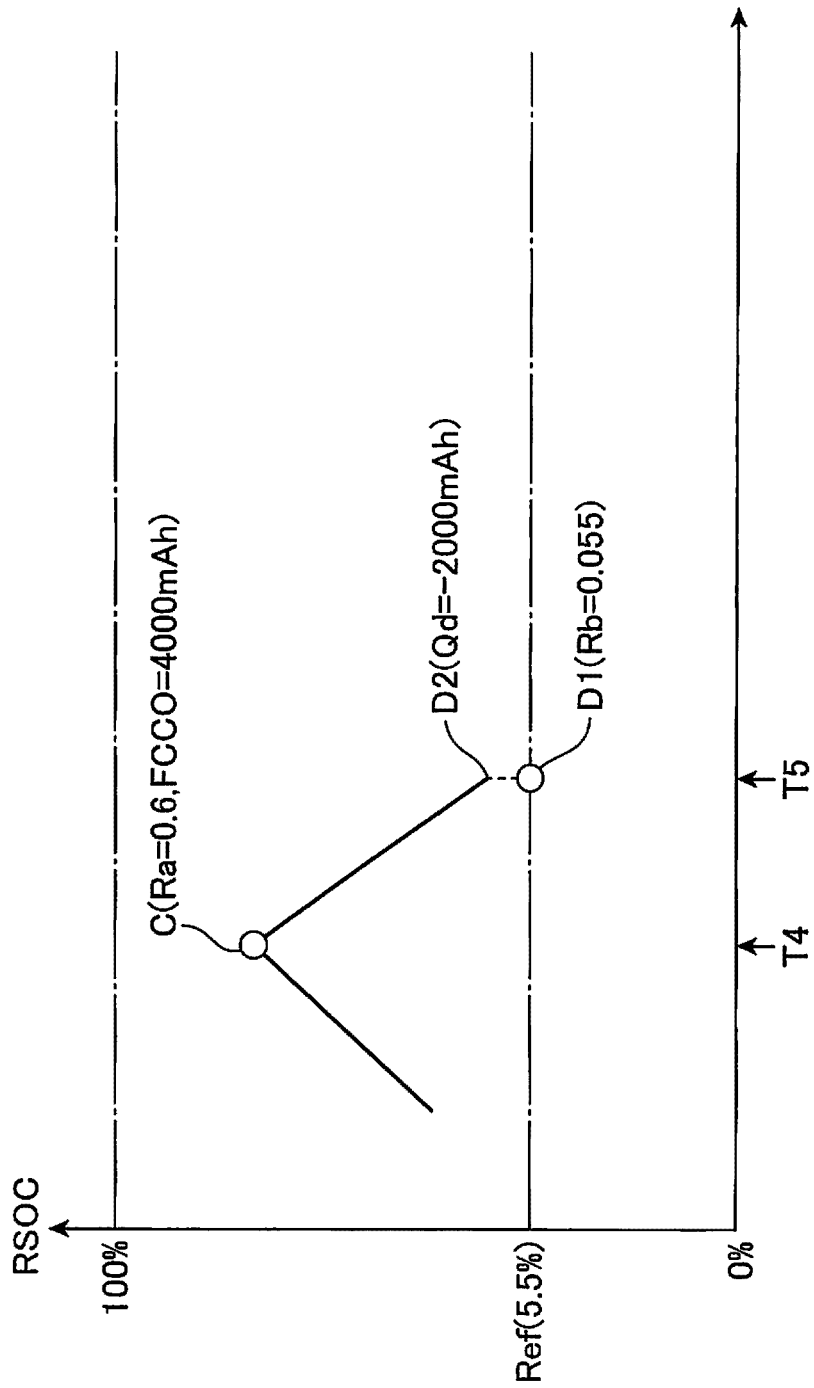

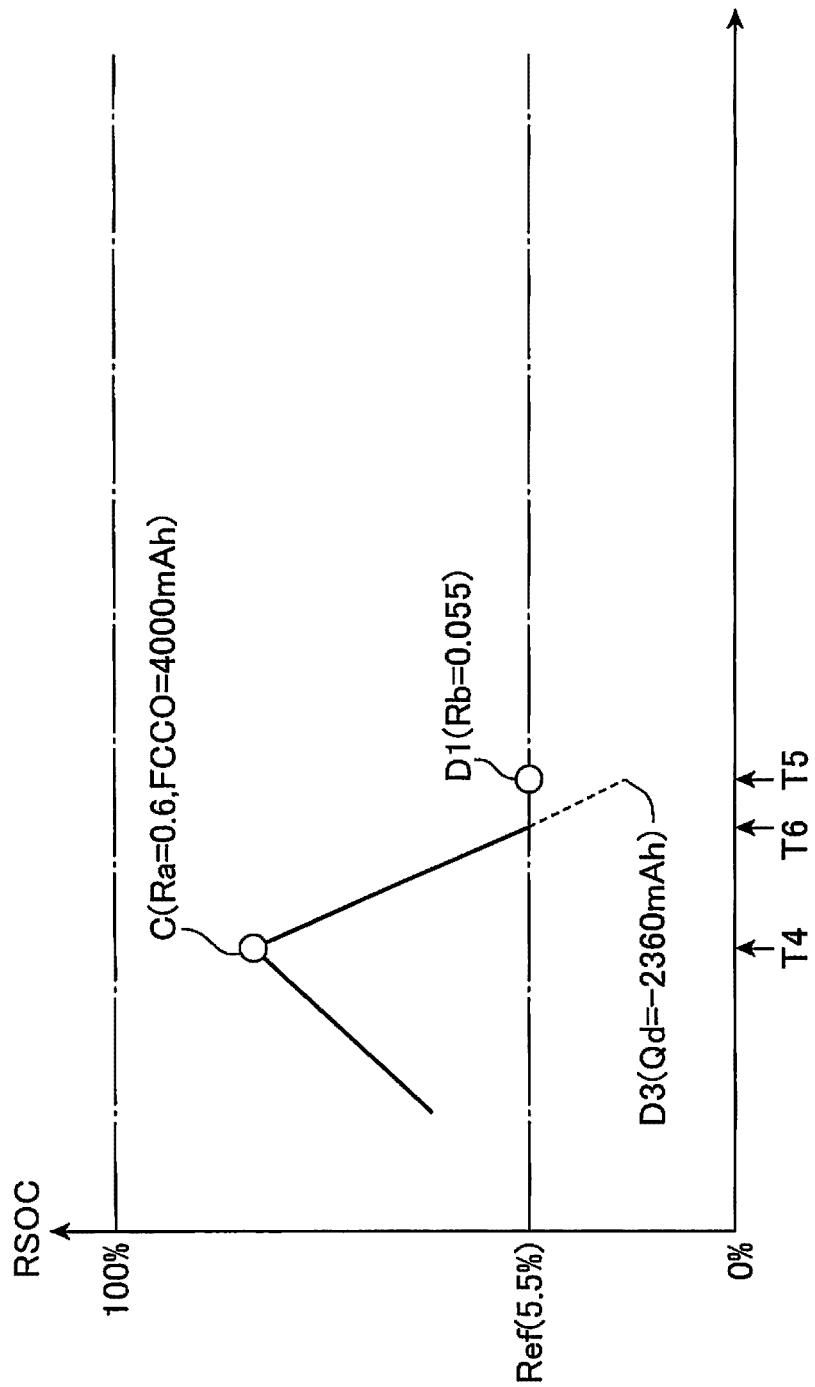

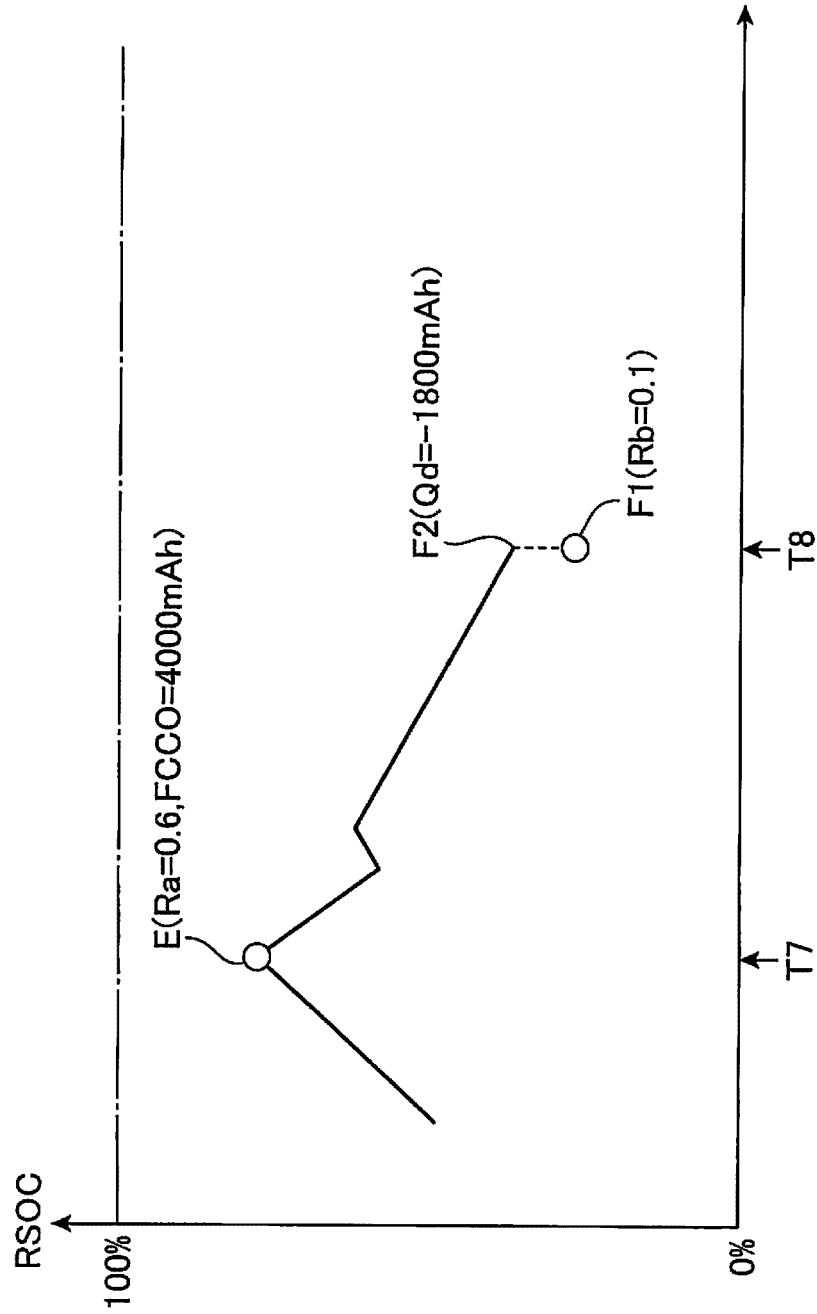

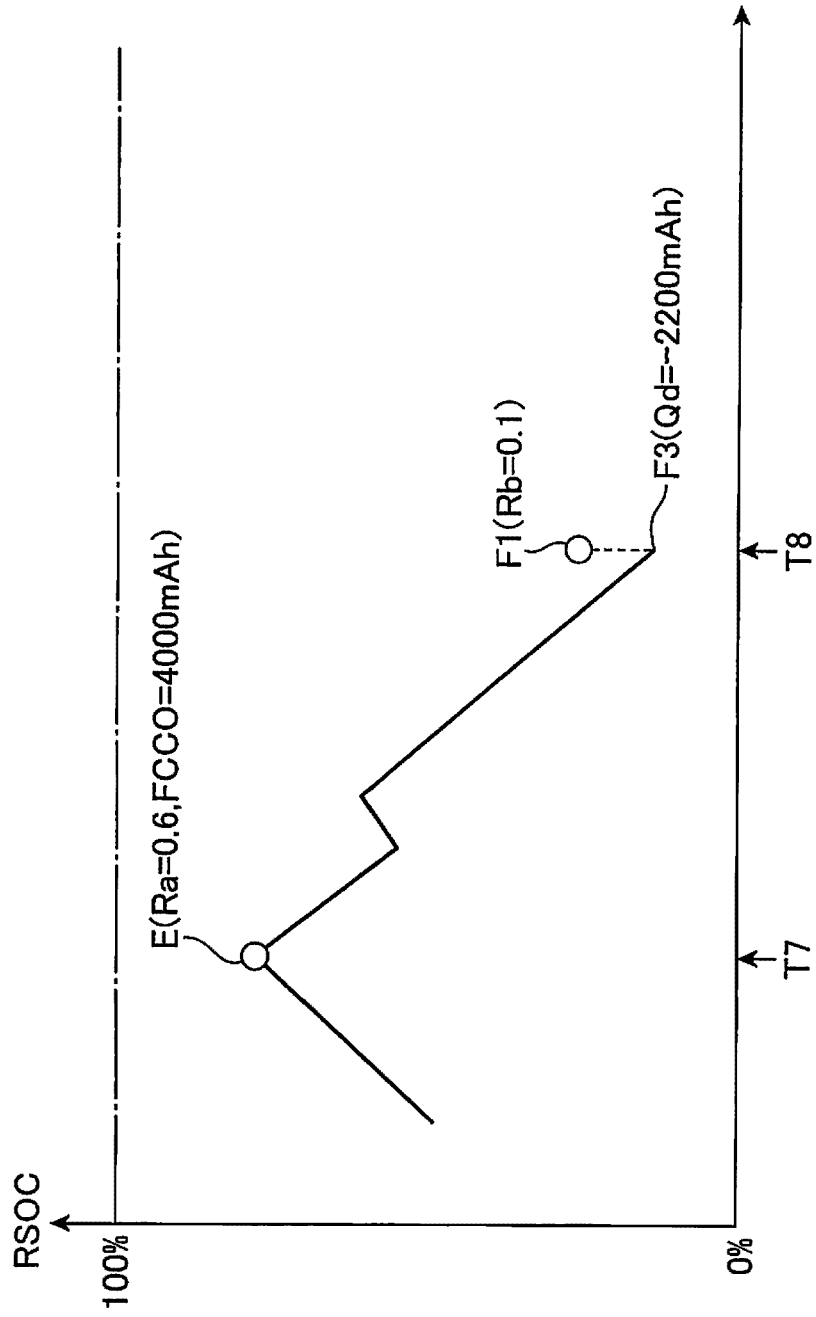

US 8,736,232 B2

FULL CHARGE CAPACITY CORRECTION CIRCUIT, CHARGING SYSTEM, BATTERY PACK AND FULL CHARGE CAPACITY CORRECTION METHOD

This application is based on U.S. Provisional Application No. 61/334,809 filed in U.S. Patent Office on May 14, 2010, the contents of which are hereby incorporated by reference. Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

BACKGROUND OF THE INVENTION

1. Field of the Invention

The present invention relates to a full charge capacity correction method for correcting a full charge capacity value of a rechargeable battery, and a full charge capacity correction circuit, a charging system, and a battery pack using the full charge capacity correction method.

2. Description of the Related Art

Conventionally, rechargeable batteries are widely used in a variety of devices and systems including electronic devices such as a mobile personal computer, a digital camera, a video camera and a mobile phone, vehicles such as an electric car and a hybrid car, hybrid elevators, power systems combining a photovoltaic cell or a power-generating device with a rechargeable battery, and battery-mounted devices and systems such as uninterruptible power source equipment.

In addition, from a usability perspective, electronic devices such as a mobile personal computer are adapted to display a remaining usable battery level that is charged in a rechargeable battery or to sound an alarm before the battery runs out.

Furthermore, in systems such as a photovoltaic generating system or a hybrid car, from a perspective of supplying power to a load in a stable manner, a rechargeable battery must be maintained in a state where the rechargeable battery is constantly charged to a certain level and, at the same time, generated surplus power and regenerative power must be absorbed. To this end, in order to prevent a fully-charged state in which a rechargeable battery can no longer be charged, charge control of the rechargeable battery is performed so that an SOC (state of charge) which represents a ratio (percentage) of a quantity of stored electricity that has already been charged to a full charge capacity (FCC) falls within a range of, for example, 20% to 80%.

In order to detect a remaining usable battery level that is charged in a rechargeable battery or calculate an SOC in this manner, a full charge capacity of the rechargeable battery must be determined. However, since a full charge capacity of a rechargeable battery decreases with deterioration of the rechargeable battery, using a factory-default full charge capacity without modification to calculate a remaining battery level or an SOC results in increased error.

In consideration thereof, a method of correcting or updating a full charge capacity is known in which a rechargeable battery is fully discharged even after the start of use by continuously discharging the rechargeable battery from a fully-charged state, whereby a full charge capacity is calculated by integrating discharge currents during the continuous discharge. However, with such a method, since a rechargeable battery that is in a used state in a device or a system must be fully discharged from a fully-charged state in order to correct the full charge capacity or the like, opportunities for correcting the full charge capacity become limited.

In consideration thereof, a method is known in which even if a rechargeable battery has not been fully discharged, a quantity of charged electricity from the start of charge until the rechargeable battery becomes fully charged is detected and the quantity of charged electricity is added to a quantity of stored electricity at start of charge (remaining capacity at start of charge) to calculate a full charge capacity (for example, refer to Japanese Patent Application Laid-open No. 2006-177764). In addition, Japanese Patent Application Laid-open No. 2006-177764 describes that the quantity of stored electricity at start of charge is determined based on battery voltage. Accordingly, a full charge capacity can be corrected even if the rechargeable battery is not fully discharged.

Meanwhile, according to the method described in Japanese Patent Application Laid-open No. 2006-177764, a data table representing a relationship between battery voltage and quantity of stored electricity (remaining capacity) is used when determining a quantity of stored electricity at start of charge based on battery voltage. In this case, as illustrated in FIG. 3 of Japanese Patent Application Laid-open No. 2006-177764, a terminal voltage of the battery has a correlation with an SOC that is a ratio (%) of a quantity of stored electricity (remaining capacity) to a full charge capacity.

Therefore, the quantity of stored electricity at start of charge must be calculated by first converting the terminal voltage of the battery into an SOC and then multiplying the full charge capacity with the SOC ratio. However, since the quantity of stored electricity at start of charge obtained in this manner is calculated based on a full charge capacity prior to correction, the quantity of stored electricity at start of charge contains an error of the full charge capacity.

As a result, there is a disadvantage in that a full charge capacity obtained by adding a quantity of charged electricity from start of charge until the rechargeable battery is fully charged to a quantity of stored electricity at start of charge (remaining capacity at start of charge) inevitably also contains errors.

SUMMARY OF THE INVENTION

An object of the present invention is to provide a full charge capacity correction circuit, a charging system, a battery pack, and a full charge capacity correction method capable of improving correction accuracy of a full charge capacity over the method described in Japanese Patent Application Laid-open No. 2006-177764 while increasing correction opportunities of a full charge capacity.

A full charge capacity correction circuit according to an aspect of the present invention includes: an integrating unit that calculates an integrated value by integrating a current value of a current flowing through a rechargeable battery; a capacity storing unit that stores a full charge capacity value that indicates a full charge capacity of the rechargeable battery; a first estimating unit that estimates a storage ratio of the rechargeable battery, which is a ratio of a quantity of stored electricity that is stored in the rechargeable battery to an actual full charge capacity of the rechargeable battery, as a first storage ratio when an estimable condition which is a condition that enables to estimate the storage ratio is satisfied; a second estimating unit that monitors whether or not the estimable condition which is a condition that enables to estimate the storage ratio is satisfied after the first storage ratio is estimated by the first estimating unit, and when the estimable condition is satisfied, estimates the storage ratio of the rechargeable battery at that moment as a second storage ratio;

a full charge capacity correction unit that estimates a full charge capacity value of the rechargeable battery based on a difference integrated value that is an integrated value integrated by the integrating unit after the first storage ratio is estimated by the first estimating unit and until the second storage ratio is estimated by the second estimating unit and on a ratio of a difference between the first storage ratio and the second storage ratio to 1, and corrects the full charge capacity value by having the capacity storing unit store the estimated full charge capacity value as a new full charge capacity value; an open circuit ratio estimating unit that uses, as the estimable condition, an open circuit voltage condition which requires a current flowing through the rechargeable battery to fall below an open circuit judgment value set in advance in order to judge that a state exists where an open circuit voltage can be obtained as a terminal voltage of the rechargeable battery, and when the open circuit voltage condition is satisfied, estimates the storage ratio of the rechargeable battery based on the terminal voltage of the rechargeable battery; and a correction control unit that uses the open circuit ratio estimating unit as at least one of the first estimating unit and the second estimating unit.

In addition, a charging system according to an aspect of the present invention includes: the full charge capacity correction circuit described above; and a charging unit that performs charging by applying a full charge voltage of the rechargeable battery to the rechargeable battery, wherein a full charge detecting unit judges that the rechargeable battery is fully charged when a current flowing through the rechargeable battery during charging by the charging unit falls below a judgment threshold set in advance.

Furthermore, a battery pack according to an aspect of the present invention includes: the full charge capacity correction circuit described above; and the rechargeable battery.

Moreover, a full charge capacity correction method according to an aspect of the present invention includes: an integrating step of calculating an integrated value by integrating a current value of a current flowing through a rechargeable battery; a first estimating step of estimating a storage ratio of the rechargeable battery, which is a ratio of a quantity of stored electricity that is stored in the rechargeable battery to an actual full charge capacity of the rechargeable battery, as a first storage ratio when an estimable condition which is a condition that enables to estimate the storage ratio is satisfied; a second estimating step of monitoring whether or not the estimable condition which is a condition that enables to estimate the storage ratio is satisfied after the first storage ratio is estimated in the first estimating step, and when the estimable condition is satisfied, estimating the storage ratio of the rechargeable battery at that moment as a second storage ratio; a full charge capacity correction step of estimating a full charge capacity value of the rechargeable battery based on a difference integrated value that is an integrated value integrated in the integrating step after the first storage ratio is estimated in the first estimating step and until the second storage ratio is estimated in the second estimating step and on a ratio of a difference between the first storage ratio and the second storage ratio to 1, and correcting the full charge capacity value by setting the estimated full charge capacity value as a new full charge capacity value; an open circuit ratio estimating step of using, as the estimable condition, an open circuit voltage condition which requires a current flowing through the rechargeable battery to fall below an open circuit judgment value set in advance in order to judge that a state exists where an open circuit voltage can be obtained as a terminal voltage of the rechargeable battery, and when the open circuit voltage condition is satisfied, estimating the stor- age ratio of the rechargeable battery based on the terminal voltage of the rechargeable battery, wherein the open circuit ratio estimating step is used as at least one of the first estimating step and the second estimating step.

BRIEF DESCRIPTION OF THE DRAWINGS

FIGS. 3A to 3C are explanatory diagrams showing an example of a look-up table that is stored in a table storing unit shown in FIG. 1;

FIG. 4 is a flowchart showing an example of an operation of a full charge capacity correction circuit shown in FIG. 1;

FIG. 5 is a flowchart showing an example of an operation of the full charge capacity correction circuit shown in FIG. 1;

FIG. 6 is a flowchart showing an example of an operation of the full charge capacity correction circuit shown in FIG. 1;

FIG. 9 is an explanatory diagram for describing a correction method of a full charge capacity value FCC when an open circuit ratio estimating unit is used as a first estimating unit and a full charge ratio estimating unit is used as a second estimating unit;

FIG. 10 is an explanatory diagram for describing a correction method of a full charge capacity value FCC when an open circuit ratio estimating unit is used as the first estimating unit and a full charge ratio estimating unit is used as the second estimating unit;

FIG. 11 is an explanatory diagram for describing a correction method of a full charge capacity value FCC when an open circuit ratio estimating unit is used as the first estimating unit and a reference ratio estimating unit is used as the second estimating unit;

FIG. 12 is an explanatory diagram for describing a correction method of a full charge capacity value FCC when an open circuit ratio estimating unit is used as the first estimating unit and a reference ratio estimating unit is used as the second estimating unit;

FIG. 13 is an explanatory diagram for describing a correction method of a full charge capacity value FCC when an open circuit ratio estimating unit is used as the first and second estimating units; and FIG. 14 is an explanatory diagram for describing a correction method of a full charge capacity value FCC when an open circuit ratio estimating unit is used as the first and second estimating units.

DESCRIPTION OF THE PREFERRED EMBODIMENTS

Figure 1:
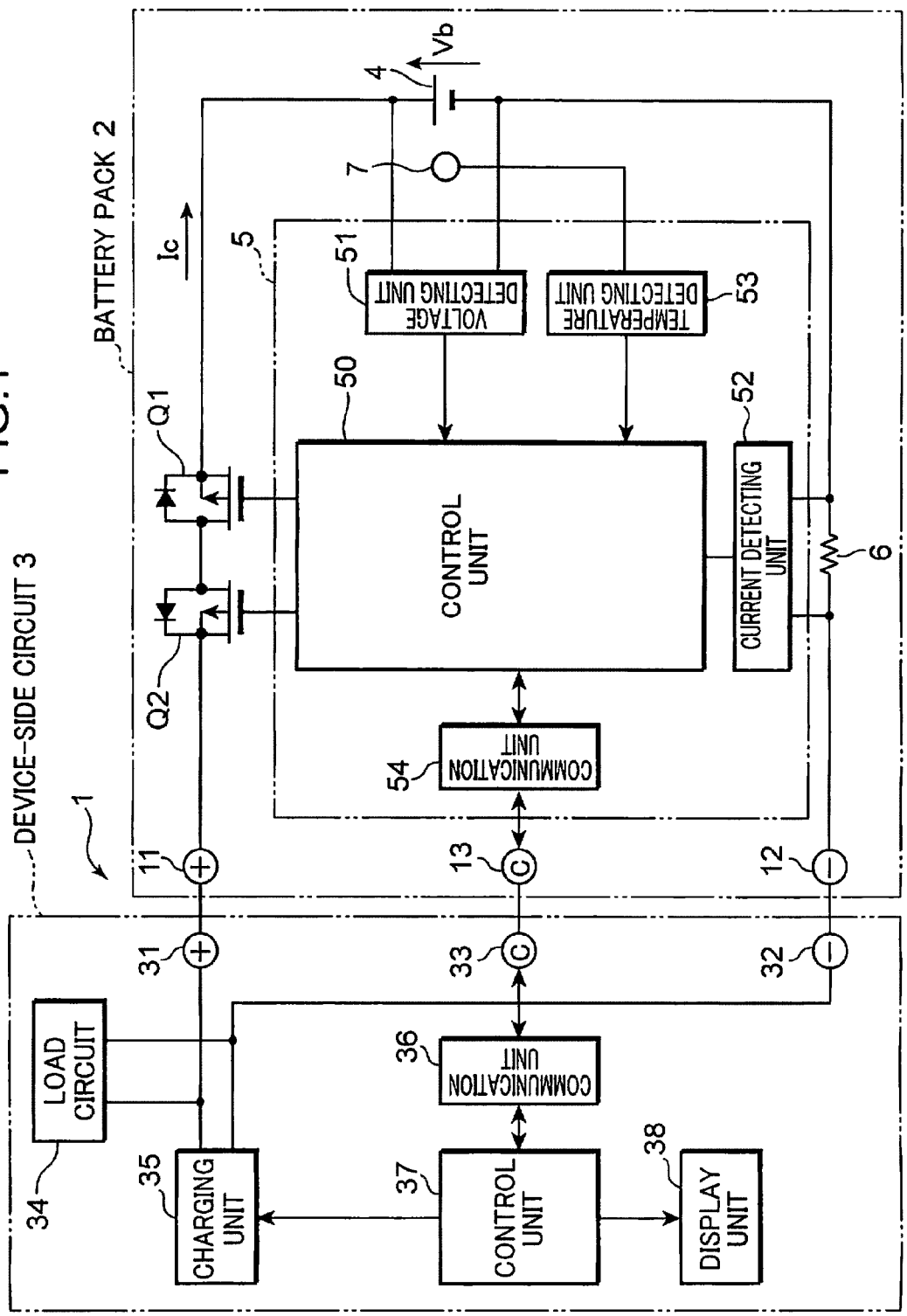
FIG. 1 is a block diagram showing an example of configurations of a battery pack and a charging system equipped with a full charge capacity correction circuit that uses a full charge capacity correction method according to an embodiment of the present invention.

Hereinafter, embodiments according to the present invention will be described with reference to the drawings. In the respective drawings, components denoted by like reference characters represent like components and descriptions thereof will be omitted. FIG. 1 is a block diagram showing an example of configurations of a battery pack 2 and a charging system 1 equipped with a full charge capacity correction circuit 5 that uses a full charge capacity correction method according to an embodiment of the present invention. The charging system 1 shown in FIG. 1 is configured as a combination of the battery pack 2 and a device-side circuit 3.

The charging system 1 is, for example, a battery-mounted device system such as a mobile personal computer, a digital camera, a mobile phone and other electronic devices, and an electric car, a hybrid car, and other vehicles. In addition, the device-side circuit 3 is a main body portion of such a battery-mounted device system, and a load circuit 34 is a load circuit that is operated by receiving power from the battery pack 2 in the battery-mounted device system.

The battery pack 2 comprises a rechargeable battery 4, a full charge capacity correction circuit 5, a current sensing resistor 6, a temperature sensor 7, switching elements Q1 and Q2, and connecting terminals 11, 12, and 13. In addition, the full charge capacity correction circuit 5 comprises a control unit 50, a voltage detecting unit 51, a current detecting unit 52, a temperature detecting unit 53, and a communication unit 54.

Moreover, the charging system 1 need not necessarily be configured so as to be separable into the battery pack 2 and the device-side circuit 3, and a single full charge capacity correction circuit 5 may be configured by the entire charging system 1. In addition, components of the full charge capacity correction circuit 5 may be apportioned between the battery pack 2 and the device-side circuit 3. Furthermore, the rechargeable battery 4 need not be configured as a battery pack and, for example, the full charge capacity correction circuit 5 may be configured as a vehicle-mounted ECU (electric control unit).

The device-side circuit 3 comprises connecting terminals 31, 32, and 33, the load circuit 34, a charging unit 35, a communication unit 36, a control unit 37, and a display unit 38. The charging unit 35 is connected to the feed connecting terminals 31 and 32, and the communication unit 36 is connected to the connecting terminal 33.

In addition, mounting the battery pack 2 to the device-side circuit 3 causes connecting terminals 11, 12, and 13 of the battery pack 2 and the connecting terminals 31, 32, and 33 of the device-side circuit 3 to be respectively connected to each other.

The communication units 54 and 36 are communication interface circuits configured so as to be capable of transmitting and receiving data between each other via the connecting terminals 13 and 33.

The charging unit 35 is a supply circuit that supplies current and voltage in accordance with a control signal from the control unit 37 to the battery pack 2 via the connecting terminals 31 and 32. For example, the charging unit 35 may be any of a supply circuit that generates a charge current of the battery pack 2 from a commercial power voltage, power generating equipment that generates power based on natural energy such as sunlight, wind power, and water power, and power generating equipment that generates power using power of an internal-combustion engine.

For the display unit 38, for example, a liquid crystal display or an LED (light emitting diode) is used. Moreover, for example, if the device-side circuit 3 is an electronic device such as a mobile personal computer or a digital camera, a display device such as a liquid crystal display that is provided on the electronic device may be used as the display unit 38.

The control unit 37 is a control circuit configured using, for example, a microcomputer. When a request instruction transmitted from the control unit 50 of the battery pack 2 by the communication unit 54 is received by the communication unit 36, the control unit 37 controls the charging unit 35 in accordance with the request instruction received by the communication unit 36 to cause a current or voltage in accordance with the request instruction transmitted from the battery pack 2 to be outputted from the charging unit 35 to the connecting terminals 11 and 12.

In the battery pack 2, the connecting terminal 11 is connected to a positive electrode of the rechargeable battery 4 via the switching element Q2 and the switching element Q1. For example, p-channel FETs (field effect transistors) are used as the switching element Q1 and the switching element Q2.

The switching element Q1 is configured such that a cathode of a parasitic diode is oriented in a direction of the rechargeable battery 4 and, when turned off, only current in a discharging direction of the rechargeable battery 4 is interrupted. In addition, the switching element Q2 is configured such that a cathode of a parasitic diode is oriented in a direction of the connecting terminal 11 and, when turned off, only current in a charging direction of the rechargeable battery 4 is interrupted. The switching elements Q1 and Q2 are normally turned on and, in case of an abnormality, are turned off to protect the rechargeable battery.

Furthermore, the connecting terminal 12 is connected to a negative electrode of the rechargeable battery 4 via the current sensing resistor 6, thereby forming a current pathway from the connecting terminal 11 to the connecting terminal 12 via the switching element Q2, the switching element Q1, the rechargeable battery 4, and the current sensing resistor 6.

Moreover, the connecting terminals 11, 12, 13, 31, 32, and 33 need only electrically connect the battery pack 2 to the device-side circuit 3 and may respectively be electrodes, connectors, terminal blocks, or the like, or a wiring pattern including a land or a pad.

The current sensing resistor 6 is a so-called shunt resistor for detecting currents, and converts a charge current and a discharge current of the rechargeable battery 4 into voltage values. Moreover, a current sensing element such as a current transformer or a Hall element, or on-resistances of the switching elements Q1 and Q2 may be used in place of the current sensing resistor 6.

The temperature sensor 7 is configured using, for example, a heat sensitive element such as a thermistor or a thermocouple, and is arranged in close contact with the rechargeable battery 4 or in a vicinity of the rechargeable battery 4. The temperature sensor 7 outputs a voltage signal indicating a temperature t of the rechargeable battery 4 to the temperature detecting unit 53.

For example, the rechargeable battery 4 may be any of a single cell, an assembled battery in which a plurality of rechargeable batteries are series-connected, an assembled battery in which a plurality of rechargeable batteries are parallel-connected, and an assembled battery connected in a combination of series and parallel connections. For example, a lithium-ion rechargeable battery is used as the rechargeable battery 4. Moreover, the rechargeable battery 4 is not limited to a lithium-ion rechargeable battery and various rechargeable batteries such as a nickel-hydride rechargeable battery and a nickel-cadmium rechargeable battery may be used instead.

However, since an open circuit ratio estimating unit 503 and a voltage conversion rate acquiring unit 505 to be described later estimate an SOC of the rechargeable battery 4 based on a terminal voltage value Vb of the rechargeable battery 4, a lithium-ion rechargeable battery whose amount of variation of a terminal voltage with respect to a variation in a remaining battery level of the rechargeable battery 4 is greater than a nickel-hydride rechargeable battery or a nickel-cadmium rechargeable battery is more suitable as the rechargeable battery 4.

The voltage detecting unit 51 is configured using, for example, an analog-to-digital converter, and detects a terminal voltage (voltage between terminals) of the rechargeable battery 4 and outputs a signal indicating a terminal voltage value Vb thereof to the control unit 50.

The current detecting unit 52 is configured using, for example, an analog-to-digital converter, and detects a voltage Vr between both terminals of the current sensing resistor 6 and outputs a signal indicating the voltage Vr to the control unit 50 as information indicating a current value Ic flowing through the rechargeable battery 4. In addition, regarding the information (voltage Vr) that indicates a current value Ic, for example, the current detecting unit 52 is adapted so as to express a charging direction of the rechargeable battery 4 by a positive value and a discharging direction of the rechargeable battery 4 by a negative value.

The control unit 50 acquires the current value Ic flowing through the rechargeable battery 4 by dividing the voltage Vr by a resistance value R of the current sensing resistor 6. The current value Ic is adapted to indicate a charge current of the rechargeable battery 4 as a positive value and a discharge current of the rechargeable battery 4 as a negative value.

The temperature detecting unit 53 is configured using, for example, an analog-to-digital converter, and converts a voltage signal outputted from the temperature sensor 7 into a digital value and outputs the digital value as a signal indicating a temperature t to the control unit 50.

Figure 2:
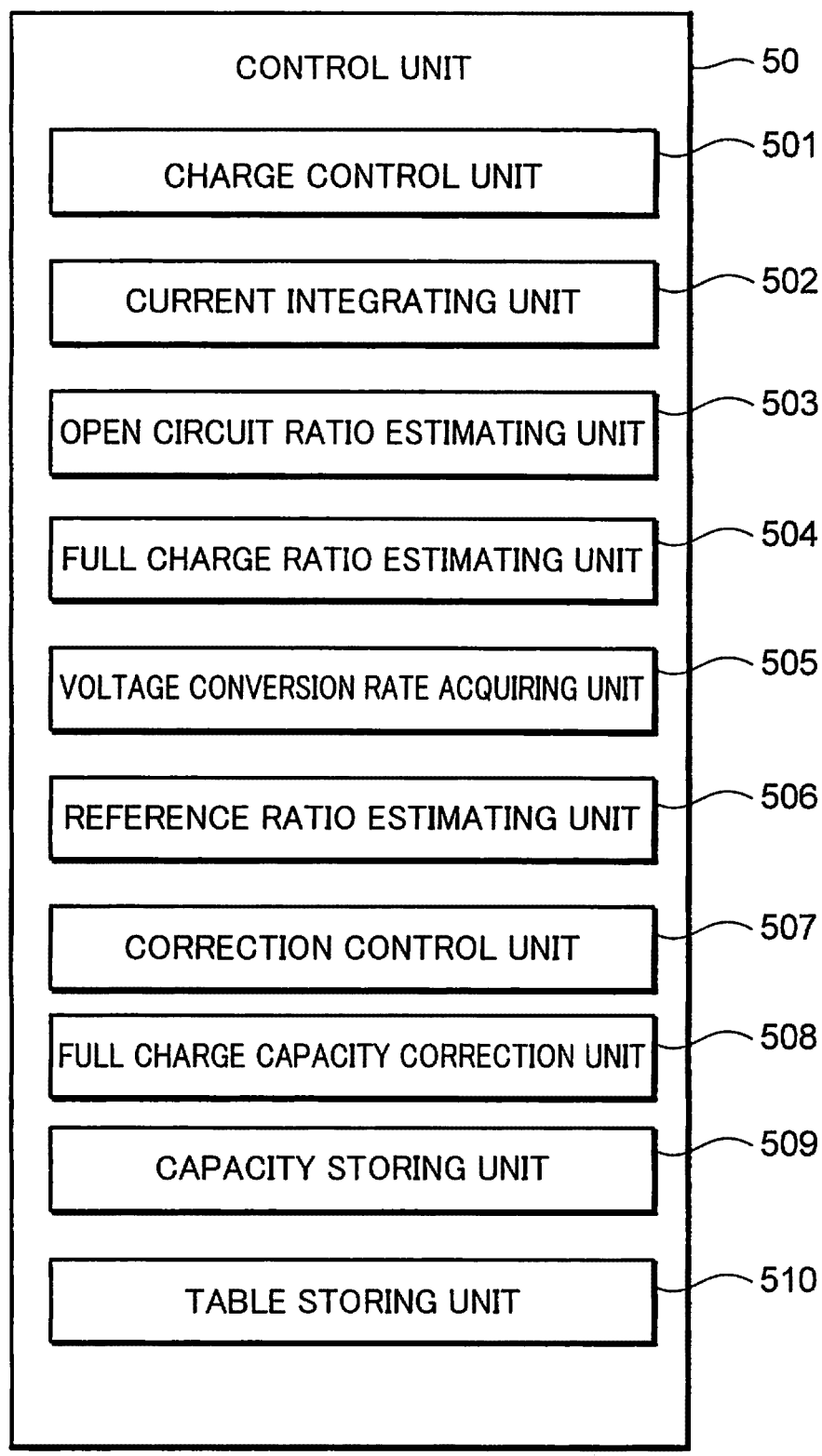
FIG. 2 is a block diagram showing an example of a control unit shown in FIG. 1.
Figure 7:
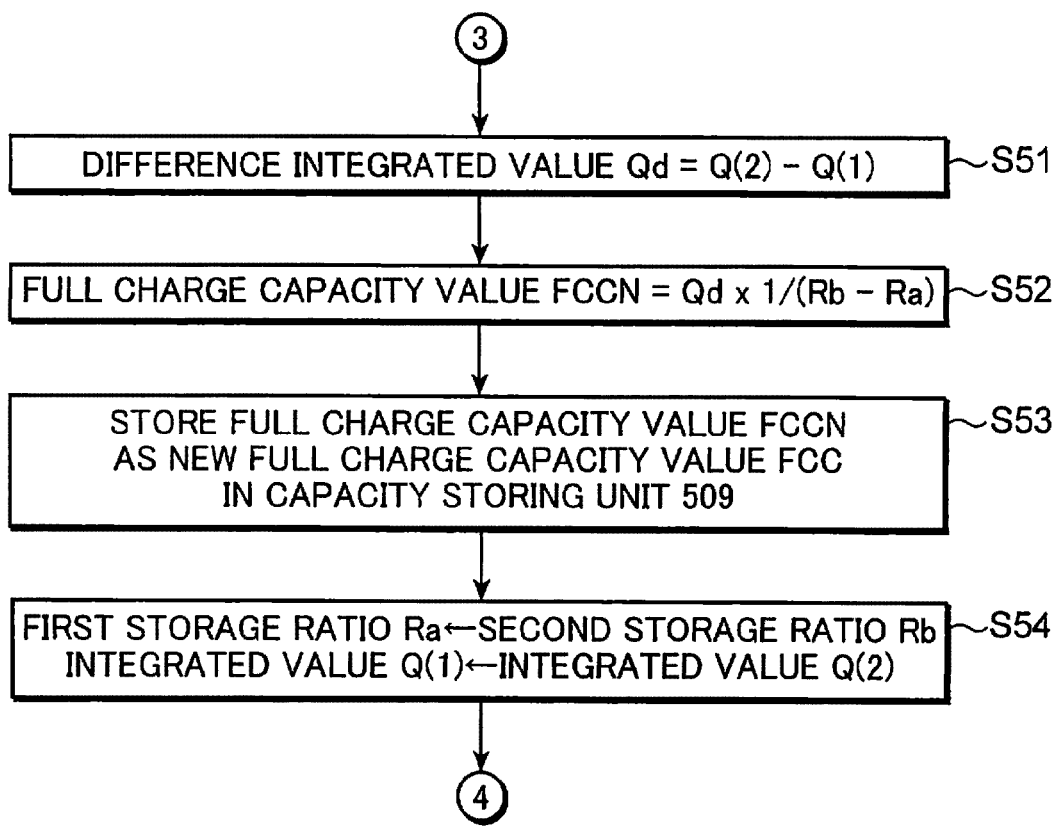
FIG. 7 is a flowchart showing an example of an operation of the full charge capacity correction circuit shown in FIG. 1.
Figure 8:
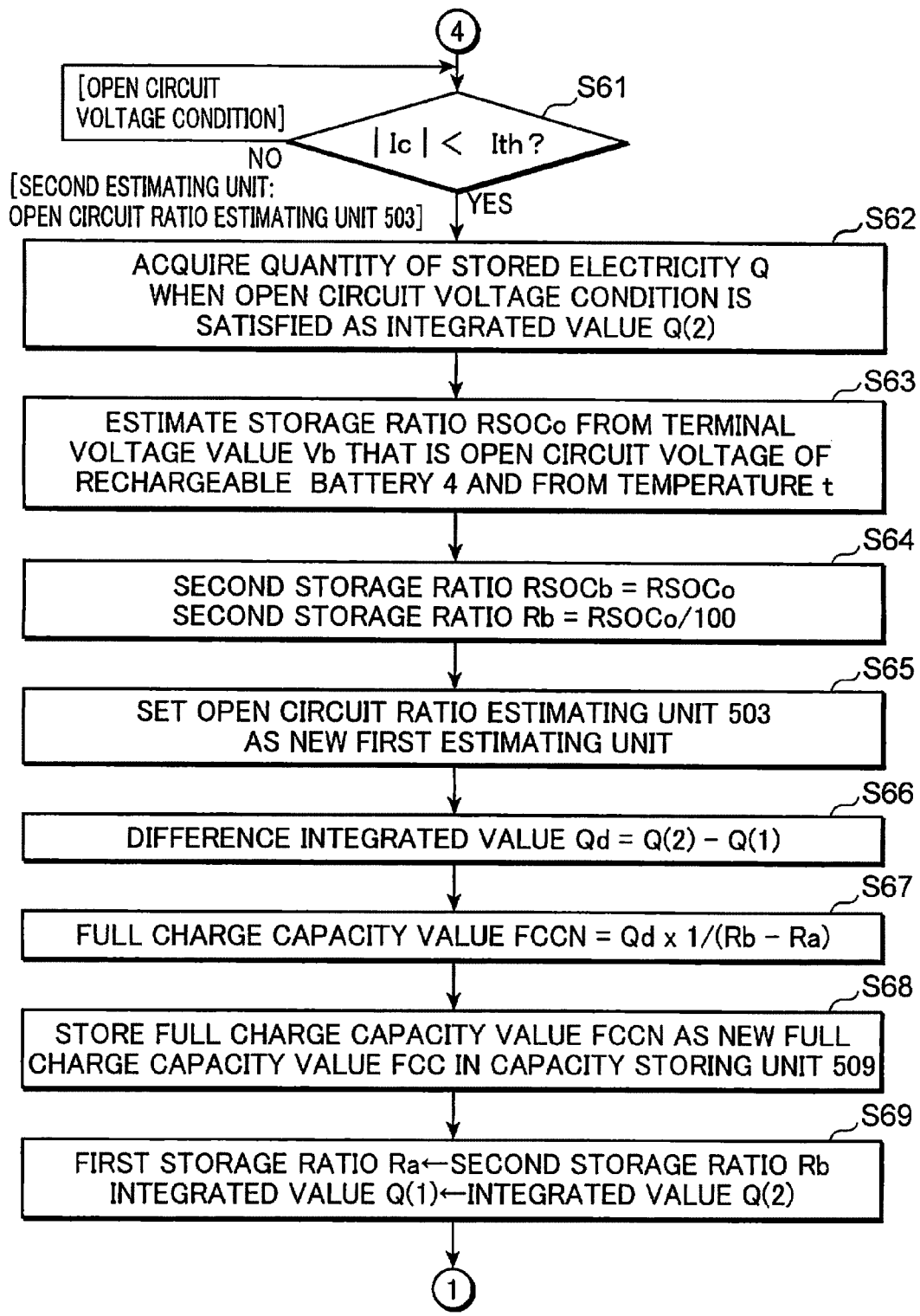
FIG. 8 is a flowchart showing an example of an operation of the full charge capacity correction circuit shown in FIG. 1.

FIG. 2 is a block diagram showing an example of the control unit 50 shown in FIG. 1. For example, the control unit 50 comprises a CPU (central processing unit) that executes predetermined arithmetic processing, a ROM (read only memory) storing a predetermined control program, a RAM (random access memory) that temporarily stores data, a capacity storing unit 509 and a table storing unit 510 constituted by a ROM or the like, and peripheral circuits thereof.

For example, by executing a control program stored in the ROM, the control unit 50 functions as a charge control unit 501 (full charge detecting unit), a current integrating unit 502 (integrating unit), an open circuit ratio estimating unit 503, a full charge ratio estimating unit 504, a voltage conversion rate acquiring unit 505, a reference ratio estimating unit 506, a correction control unit 507, and a full charge capacity correction unit 508.

For example, when a user attempts to start charging by connecting an AC adapter (not shown) to the charging unit 35, the charge control unit 501 (full charge detecting unit) receives a notification of the user's intention to start charging from the control unit 37.

In addition, the charge control unit 501 controls operations of the charging unit 35 by outputting an instruction signal, which requests a predetermined charge current or charge voltage to be supplied, to the device-side circuit 3 via the communication unit 54. Subsequently, for example, the charge control unit 501 causes the charging unit 35 to execute a CCCV (constant current constant voltage) charge.

The charge control unit 501 then causes a CV charge (constant voltage charge) to be executed by having the charging unit 35 output a full charge voltage of the rechargeable battery 4. When the current value Ic detected by the current detecting unit 52 falls below a judgment threshold Ie set in advance as a charge end condition during execution of the CV charge, the charge control unit 501 judges that the rechargeable battery 4 has been fully charged and ends the charge operation by the charging unit 35. At this point, the charge control unit 501 notifies that the rechargeable battery 4 has been fully charged to the full charge ratio estimating unit 504 and the correction control unit 507.

The judgment threshold Ie is set to, for example, around 0.05 It, where 1 It (battery capacity (Ah)/1 (h)) represents a current value such that a remaining capacity of a rechargeable battery becomes zero in 1 hour when discharging a quantity of electricity of a nominal capacity value of the rechargeable battery at a current value of 1 It.

In this case, the charge control unit 501 corresponds to an example of a full charge detecting unit. Moreover, the charge control unit 501 is not limited to an example in which CCCV charge is performed and may perform charging using other charging methods. Whichever charging method may be adopted, when a charge end condition according to the adopted charging method is satisfied and the rechargeable battery 4 becomes fully charged, the charge control unit 501 need only notify the full charge ratio estimating unit 504 and the correction control unit 507 that the rechargeable battery 4 has been fully charged.

A full charge capacity value FCC as a default value is stored in advance in the capacity storing unit 509 upon, for example, shipment of the battery pack 2. For example, a theoretically-calculated value or an actually measured value is stored in advance as the default value of the full charge capacity value FCC. In addition, the full charge capacity value FCC stored in the capacity storing unit 509 is adapted to be corrected as needed by the full charge capacity correction unit 508.

The table storing unit 510 stores, in advance, a look-up table LT which associates an RSOC (relative state of charge) that is a value representing, as a percentage, a storage ratio of the rechargeable battery 4, which is a ratio of a quantity of stored electricity to an actual full charge capacity of the rechargeable battery 4, a current value Ic flowing through the rechargeable battery 4, and a temperature t of the rechargeable battery with a terminal voltage value Vb of the rechargeable battery 4.

FIG. 3 are explanatory diagrams showing an example of the look-up table LT that is stored in the table storing unit 510 shown in FIG. 1. FIG. 3A shows a correspondence relationship between the terminal voltage value Vb (V11a to V54a), the current value Ic, and the temperature t of the rechargeable battery 4 when the RSOC is set to 95%. FIG. 3B shows a correspondence relationship between the terminal voltage value Vb (V11b to V54b), the current value Ic of the rechargeable battery 4, and the temperature t of the rechargeable battery 4 when the RSOC is set to 50%. FIG. 3C shows a correspondence relationship between the terminal voltage value Vb (V11c to V54c), the current value Ic, and the temperature t of the rechargeable battery 4 when the RSOC is set to 5.5%.

As for the look-up table LT shown in FIG. 3, for example, data experimentally measured using a new rechargeable battery 4 is stored in advance in the ROM. While FIG. 3 illustrates a look-up table LT corresponding to RSOCs of 95%, 50%, and 5.5%, the table storing unit 510 stores a look-up table LT corresponding to a total RSOC range of 0% to 100%.

Here, since the greater the quantity of stored electricity of the rechargeable battery 4 or, in other words, the greater the RSOC, the higher the terminal voltage value Vb, under a condition in which the current value Ic and the temperature t are constant (do not vary), a relationship expressed as Va>Vb>V**c (where * denotes a single arbitrary character) exists in FIGS. 3A, 3B, and 3C.

In addition, when a current flows through the rechargeable battery 4, due to a voltage generated by an internal resistance of the rechargeable battery 4, the greater the current value Ic, the higher the terminal voltage value Vb. In other words, a charge current increases during charging, and the greater the current value Ic, the higher the terminal voltage value Vb. On the other hand, during discharge, a current in a discharging direction decreases and an absolute value of the current value Ic that is a negative value decreases. In other words, the greater the current value Ic, the higher the terminal voltage value Vb (the smaller the amount of decrease in the terminal voltage value Vb).

Therefore, in FIGS. 3A, 3B, and 3C, under a condition in which the RSOC and the temperature t are constant (do not vary), a relationship expressed as $V1^{}>V2^{}>V3^{}>V4^{}>V5^{**}$ (where * denotes a single arbitrary character) exists.

Furthermore, the correspondence relationship between the RSOC and the terminal voltage value Vb of the rechargeable battery 4 varies according to the temperature t and, generally, the higher the temperature t, the lower the terminal voltage value Vb corresponding to the same RSOC. Therefore, in FIGS. 3A, 3B, and 3C, under a condition in which the RSOC and the current value Ic are constant (do not vary), a relationship expressed as $V^*1^*>V^*2^*>V^*3^*>V^*4^*>V^*5^*$(where * denotes a single arbitrary character) exists.

Moreover, depending on materials that constitute the positive electrode and the negative electrode of the battery, there may be cases where an increase in the temperature t causes the terminal voltage value Vb corresponding to the same RSOC to increase. Therefore, the relationship among $V^*1^*$, $V^*2^*$, $V^*3^*$, $V^*4^*$, and $V^*5^*$ in FIGS. 3A, 3B, and 3C may be suitably set according to properties of the rechargeable battery 4.

While the look-up table LT shown in FIG. 3 associates the RSOC, the terminal voltage value Vb, the current value Ic, and the temperature t of the rechargeable battery 4 with each other, the look-up table LT need not necessarily include the temperature t of the rechargeable battery 4 as a parameter. In addition, the look-up table LT need not necessarily include the temperature t and the current value Ic as parameters.

The current integrating unit 502 calculates a quantity of stored electricity that is charged to the rechargeable battery 4 as a quantity of stored electricity Q (integrated value) by integrating, per unit time, the current value Ic detected by the current detecting unit 52. In this case, since the current value Ic for a current in a charging direction of the rechargeable battery 4 is expressed as positive and the current value Ic for a current in a discharging direction of the rechargeable battery 4 is expressed as negative, the current integrating unit 502 calculates the quantity of stored electricity Q charged to the rechargeable battery 4 by adding a quantity of stored electricity that is charged to the rechargeable battery 4 and subtracting a quantity of discharged electricity that is discharged from the rechargeable battery 4.

The control unit 50 calculates a ratio (percentage) of the quantity of stored electricity Q with respect to the full charge capacity value FCC stored in the capacity storing unit 509 as an RSOC.

The RSOC is given by the following expression (A).

$$RSOC=(Q/FCC)\times 100(\%) \quad (A)$$

Subsequently, by transmitting the RSOC obtained as described above as an RSOC of the rechargeable battery 4 from the control unit 50 to the control unit 37, notification of the RSOC of the rechargeable battery 4 is made to the device-side circuit 3.

When an absolute value of the current value Ic detected by the current detecting unit 52 falls below an open circuit judgment value Ith set in advance, the open circuit ratio estimating unit 503 acquires the terminal voltage value Vb detected by the voltage detecting unit 51 and the temperature t detected by the temperature detecting unit 53. Subsequently, when the combination of the acquired terminal voltage value Vb and temperature t substantially matches a combination of the terminal voltage value Vb and the temperature t associated as values when the current value Ic is 0 A in the look-up table LT, the open circuit ratio estimating unit 503 estimates the RSOC associated to the matched combination to be a storage ratio RSOCo of the rechargeable battery 4.

The open circuit ratio estimating unit 503 uses a condition that requires the absolute value of the current value Ic to fall below the open circuit judgment value Ith as an open circuit voltage condition. In this case, since the storage ratio RSOCo is acquired based on an open circuit voltage of the rechargeable battery 4 and an influence of the temperature t is reduced, a detection accuracy of the storage ratio RSOCo is improved.

Since the look-up table LT associates the terminal voltage value Vb and the RSOC such that the higher the terminal voltage value Vb, the greater the SOC of the rechargeable battery 4, the open circuit ratio estimating unit 503 increases the storage ratio RSOCo as the terminal voltage value Vb rises.

Moreover, the open circuit ratio estimating unit 503 is not limited to an example in which the storage ratio RSOCo is estimated using the terminal voltage value Vb and the temperature t, and may alternatively estimate the storage ratio RSOCo only using the terminal voltage value Vb.

The open circuit judgment value Ith is a threshold set in advance in order to judge that a state exists where an open circuit voltage can be obtained as the terminal voltage value Vb of the rechargeable battery 4 or, in other words, to judge that the current value Ic is substantially 0 A. For example, a value comparable to a value obtained by adding a detection error of the current detecting unit 52 to 0 A can be used as the open judgment value Ith. Alternatively, a minute current value comparable with a leakage current or a standby current which flows when the user is not using the device-side circuit 3 and which has no substantial effect on the terminal voltage value Vb may be set as the open circuit judgment value Ith.

When the open circuit ratio estimating unit 503 is used as a first estimating unit by the correction control unit 507, the open circuit ratio estimating unit 503 estimates the storage ratio RSOCo as a first storage ratio RSOCa. In addition, when the open circuit ratio estimating unit 503 is used as a second estimating unit by the correction control unit 507, the open circuit ratio estimating unit 503 estimates the storage ratio RSOCo as a second storage ratio RSOCb.

Since the open circuit ratio estimating unit 503 estimates the storage ratio RSOCo based on an open circuit voltage of the rechargeable battery 4, an estimation accuracy of the first storage ratio RSOCa and the second storage ratio RSOCb is improved in comparison to the reference ratio estimating unit 506 that estimates a storage ratio RSOCr from the terminal voltage value Vb in a state where a current flows through the rechargeable battery 4.

When a full charge notification from the charge control unit 501 is received by the full charge ratio estimating unit 504, the full charge ratio estimating unit 504 judges that a full charge condition has been satisfied and estimates that a storage ratio RSOCf of the rechargeable battery 4 is 100% (ratio: 1).

When the full charge ratio estimating unit 504 is used as a first estimating unit by the correction control unit 507, the full charge ratio estimating unit 504 estimates the storage ratio RSOCf as the first storage ratio RSOCa. In addition, when the full charge ratio estimating unit 504 is used as a second estimating unit by the correction control unit 507, the full charge ratio estimating unit 504 estimates the storage ratio RSOCf as the second storage ratio RSOCb.

The voltage conversion rate acquiring unit 505 estimates a storage ratio RSOCv of the rechargeable battery 4 using the terminal voltage value Vb detected by the voltage detecting unit 51, the current value Ic detected by the current detecting unit 52, and the temperature t detected by the temperature detecting unit 53.

Specifically, when the combination of the terminal voltage value Vb, the current value Ic, and the temperature t substantially matches a combination of the terminal voltage value Vb, the current value Ic, and the temperature t associated in the look-up table LT, the voltage conversion rate acquiring unit 505 estimates the RSOC associated to the matched combination to be the storage ratio RSOCv.

Since the look-up table LT associates the terminal voltage value Vb and the SOC such that the higher the terminal voltage value Vb, the greater the SOC of the rechargeable battery 4, the voltage conversion rate acquiring unit 505 increases the storage ratio RSOCv as the terminal voltage value Vb rises.

In addition, the look-up table LT associates the current value Ic and the terminal voltage value Vb such that the greater the current value Ic with respect to the same RSOC or, in other words, the greater the current value Ic in a charging direction and the smaller an absolute value of the current value Ic in a discharging direction, the higher the terminal voltage value Vb. Therefore, by collating the current value Ic detected by the current detecting unit 52 and the terminal voltage value Vb detected by the voltage detecting unit 51 with the look-up table LT, the voltage conversion rate acquiring unit 505 estimates the storage ratio RSOCv so that the greater the current value Ic, the smaller the storage ratio RSOCv.

Furthermore, the look-up table LT associates the temperature t with the terminal voltage value Vb such that for the same SOC, the higher the temperature t, the lower the terminal voltage value Vb. Therefore, by collating the temperature t detected by the temperature detecting unit 53 and the terminal voltage value Vb detected by the voltage detecting unit 51 with the look-up table LT, the voltage conversion rate acquiring unit 505 estimates the storage ratio RSOCv so that the higher the temperature t, the greater the storage ratio RSOCv.

As described above, since the look-up table LT associates a plurality of parameters correlated to the RSOC of the rechargeable battery 4, namely, the terminal voltage value Vb, the current value Ic, and the temperature t with the RSOC of the rechargeable battery 4, influences of the current value Ic and the temperature t are reduced from the storage ratio RSOCv. As a result, the voltage conversion rate acquiring unit 505 can accurately estimate the storage ratio RSOCv.

Meanwhile, while values set in the look-up table LT are discrete values, the terminal voltage value Vb detected by the voltage detecting unit 51, the current value Ic detected by the current detecting unit 52, and the temperature t detected by the temperature detecting unit 53 vary continuously. In consideration thereof, the open circuit ratio estimating unit 503 and the voltage conversion rate acquiring unit 505 are adapted to apply approximate processing that involves, for example, round off or round up to the terminal voltage value Vb, the current value Ic, and the temperature t before collating with the look-up table LT. The term "substantially match" signifies the inclusion of cases where the terminal voltage value Vb, the current value Ic, and the temperature t match after being subjected to approximate processing such as round off or round up.

Moreover, the voltage conversion rate acquiring unit 505 is not limited to an example in which the storage ratio RSOCv is estimated using the terminal voltage value Vb, the current value Ic, and the temperature t. Alternatively, the voltage conversion rate acquiring unit 505 may estimate the storage ratio RSOCv using only the terminal voltage value Vb, using the terminal voltage value Vb and the current value Ic, or using the terminal voltage value Vb and the temperature t.

The reference ratio estimating unit 506 uses a reference condition which requires the storage ratio RSOCv estimated by the voltage conversion rate acquiring unit 505 to be equal to a reference value Ref set in advance. When the storage ratio RSOCv equals the reference value Ref, the reference ratio estimating unit 506 estimates that a storage ratio RSOCr of the rechargeable battery 4 is equal to the storage ratio RSOCv or, in other words, the reference value Ref.

Here, the rechargeable battery has a first range that is a region in which an amount of variation of the terminal voltage value Vb with respect to a variation of the storage ratio RSOC is large and a second range that is a region in which an amount of variation of the terminal voltage value Vb with respect to a variation of the storage ratio RSOC is small. Accordingly, an accuracy of the storage ratio RSOCv estimated based on the terminal voltage value Vb by the voltage conversion rate acquiring unit 505 in the second range decreases in comparison to an accuracy of the storage ratio RSOCv estimated based on the terminal voltage value Vb by the voltage conversion rate acquiring unit 505 in the first range.

In consideration thereof, a value selected from the storage ratios belonging to the first range is desirably set as the reference value Ref since the estimation accuracy of the storage ratio RSOCv by the voltage conversion rate acquiring unit 505 increases.

For example, in a case of a lithium-ion rechargeable battery, a region where the RSOC is equal to or lower than 10% becomes the first range that is a region in which an amount of variation of the terminal voltage value Vb with respect to a variation of the storage ratio RSOC is large. Therefore, a value in the first range such as 5.5% is desirably used as the reference value Ref.

When the reference ratio estimating unit 506 is used as a first estimating unit by the correction control unit 507, the reference ratio estimating unit 506 estimates the storage ratio RSOCr as the first storage ratio RSOCa. In addition, when the reference ratio estimating unit 506 is used as a second estimating unit by the correction control unit 507, the reference ratio estimating unit 506 estimates the storage ratio RSOCr as the second storage ratio RSOCb.

When any of the open circuit voltage condition of the open circuit ratio estimating unit 503, the full charge condition of the full charge ratio estimating unit 504, and the reference condition of the reference ratio estimating unit 506 is satisfied, the correction control unit 507 uses the estimating unit using the satisfied condition as the first estimating unit. In addition, when the open circuit ratio estimating unit 503 is used as the first estimating unit, the correction control unit 507 uses any of the full charge ratio estimating unit 504 and the reference ratio estimating unit 506 as a second estimating unit, and when any of the full charge ratio estimating unit 504 and the reference ratio estimating unit 506 is used as the first estimating unit, the correction control unit 507 uses the open circuit ratio estimating unit 503 as the second estimating unit.

Using the open circuit ratio estimating unit 503 as the first estimating unit means estimating the storage ratio RSOCo as the first storage ratio RSOCa by the open circuit ratio estimating unit 503. Using the open circuit ratio estimating unit 503 as the second estimating unit means estimating the storage ratio RSOCo as the second storage ratio RSOCb by the open circuit ratio estimating unit 503 after the first storage ratio is estimated by the first estimating unit.

Further, using the full charge ratio estimating unit 504 as the first estimating unit means estimating the storage ratio RSOCf as the first storage ratio RSOCa by the full charge ratio estimating unit 504. Using the full charge ratio estimating unit 504 as the second estimating unit means estimating the storage ratio RSOCf as the second storage ratio RSOCb by the full charge ratio estimating unit 504 after the first storage ratio is estimated by the first estimating unit.

Furthermore, using the reference ratio estimating unit 506 as the first estimating unit means estimating the storage ratio RSOCr as the first storage ratio RSOCa by the reference ratio estimating unit 506. Using the reference ratio estimating unit 506 as the second estimating unit means estimating the storage ratio RSOCr as the second storage ratio RSOCb by the reference ratio estimating unit 506 after the first storage ratio is estimated by the first estimating unit.

In addition, the words "use, uses, using, used" can be replaced by the words "set, sets, setting, set".

In addition, when the second storage ratio RSOCb is estimated by the second estimating unit and a new full charge capacity value FCC is stored in the capacity storing unit 509 by the full charge capacity correction unit 508, the correction control unit 507 uses the estimating unit used as the second estimating unit as the first estimating unit, and by setting the estimated second storage ratio RSOCb as the first storage ratio RSOCa, the correction control unit 507 assumes that a new first storage ratio RSOCa has been estimated and once again causes estimation of a new full charge capacity value FCC to be started. The correction control unit 507 continuously repeats correction of the full charge capacity value FCC in this manner.

The full charge capacity correction unit 508 acquires an integrated value integrated by the current integrating unit 502 after the first storage ratio RSOCa is estimated by the first estimating unit and until the second storage ratio RSOCb is estimated by the second estimating unit as a difference integrated value Qd. The full charge capacity correction unit 508 calculates the difference integrated value Qd by, for example, subtracting an integrated value integrated by the current integrating unit 502 when the first storage ratio RSOCa is estimated by the first estimating unit from an integrated value integrated by the current integrating unit 502 when the second storage ratio RSOCb is estimated by the second estimating unit.

As the difference integrated value Qd, an integrated value integrated by the current integrating unit 502 after the first storage ratio RSOCa is estimated by the first estimating unit and until the second storage ratio RSOCb is estimated by the second estimating unit is to suffice. Therefore, charging and discharging may be performed during this period, and the charging and discharging need not necessarily be performed continuously.

In addition, the difference integrated value Qd may also be acquired by providing another current integrating unit for full charge capacity correction in addition to the current integrating unit 502 used for RSOC detection of the rechargeable battery 4, whereby the current integrating unit is used to integrate the current value Ic after the first storage ratio RSOCa is estimated by the first estimating unit and until the second storage ratio RSOCb is estimated by the second estimating unit.

Assuming that a ratio expressed by the first storage ratio RSOCa obtained by the first estimating unit is a first storage ratio Ra and a ratio expressed by the second storage ratio RSOCb obtained by the second estimating unit is a second storage ratio Rb, the full charge capacity correction unit 508 calculates a new full charge capacity value FCCN based on the following expression (1).

$$\text{Full charge capacity value } FCCN = Qd \times 1/(Rb-Ra) \quad (1)$$

Subsequently, the full charge capacity correction unit 508 corrects the full charge capacity value FCC by having the full charge capacity value FCCN obtained in this manner stored in the capacity storing unit 509 as a new full charge capacity value FCC.

Moreover, instead of correcting the full charge capacity value FCC based on the expression (1) above, the full charge capacity correction unit 508 may be adapted to correct the full charge capacity value FCC according to a differential correction method described below.

That is, as a differential correction method, the full charge capacity correction unit 508 calculates a first quantity of electricity QF that is a summation value of a product obtained by multiplying a full charge capacity value FCCO prior to correction stored in the capacity storing unit 509 by the first storage ratio Ra and the difference integrated value Qd using the following expression (2).

$$QF = FCCO \times Ra + Qd \quad (2)$$

In addition, the full charge capacity correction unit 508 calculates a second quantity of electricity QS that is a product of the full charge capacity value FCCO and the second storage ratio using the following expression (3).

$$QS = FCCO \times Rb \quad (3)$$

Subsequently, when Ra<Rb and QF<QS, the full charge capacity correction unit 508 calculates the new full charge capacity value FCCN based on the following expression (4), when Ra<Rb and QF>QS, the full charge capacity correction unit 508 calculates the new full charge capacity value FCCN based on the following expression (5), when Ra>Rb and QF<QS, the full charge capacity correction unit 508 calculates the new full charge capacity value FCCN based on the following expression (5), and when Ra>Rb and QF>QS, the full charge capacity correction unit 508 calculates the new full charge capacity value FCCN based on the following expression (4).

$$\text{Full charge capacity value } FCCN = FCCO - \{|QS-QF| \times (1/|Rb-Ra|)\} \quad (4)$$

$$\text{Full charge capacity value } FCCN = FCCO + \{|QS-QF| \times (1/|Rb-Ra|)\} \quad (5)$$

Here, when the first storage ratio Ra is estimated by the first estimating unit, by configuring the full charge capacity correction unit 508 to set FCCO×Ra as a quantity of stored electricity Q of the current integrating unit 502 and have the current integrating unit 502 continue integrating the current value Ic with respect to the quantity of stored electricity Q, processing can be simplified because the quantity of stored electricity Q when the second storage ratio Rb is estimated by the second estimating unit can be used without modification as the first quantity of electricity QF.

In addition, since the value of the quantity of stored electricity Q is used as an estimated value (detected value) of the quantity of stored electricity of the rechargeable battery 4, by setting FCCO×Ra as the quantity of stored electricity Q when the first storage ratio Ra is estimated by the first estimating unit, an estimation accuracy of a quantity of stored electricity of the rechargeable battery 4 can be improved.

Moreover, since the first storage ratio Ra and the first storage ratio RSOCa as well as the second storage ratio Rb and the second storage ratio RSOCb respectively represent the same ratios albeit using different ratio expression methods, both first storage ratios and both second storage ratios are respectively equivalent to each other. Therefore, "1/(Rb−Ra)" in the expression (1) may be substituted by "100/(RSOCb−RSOCa)", and "1/|Rb−Ra|" in the expressions (4) and (5) may be substituted by "100/|RSOCb−RSOCa|". In this case, "1/(Rb−Ra)" and "100/(RSOCb−RSOCa)" in the expression (1) and "1/|Rb−Ra|" and "100/|RSOCb−RSOCa|" in the expressions (4) and (5) correspond to examples of "a difference integrated value, and a ratio of a difference between a first storage ratio and a second storage ratio to 1".

Next, operations of the full charge capacity correction circuit 5 shown in FIG. 1 will be described. FIGS. 4 to 8 are flowcharts showing examples of operations of the full charge capacity correction circuit 5 shown in FIG. 1.

First, a current value Ic flowing through the rechargeable battery 4 is detected by the current detecting unit 52, a terminal voltage value Vb is detected by the voltage detecting unit 51, and a temperature t is detected by the temperature detecting unit 53 (step S1). Next, the current value Ic is integrated per unit time by the current integrating unit 502 and a quantity of stored electricity Q charged to the rechargeable battery 4 is calculated (step S2). The voltage conversion rate acquiring unit 505 then estimates and acquires a storage ratio RSOCv from the current value Ic, the terminal voltage value Vb, and the temperature t (step S3).

The steps S1 to S3 are constantly being executed in parallel to processing described below, and the current value Ic, the terminal voltage value Vb, the temperature t, the quantity of stored electricity Q, and the storage ratio RSOCv are adapted to be constantly updated to latest values.

Next, the correction control unit 507 compares an absolute value of the current value Ic with the open circuit judgment value Ith (step S4) to confirm an open circuit voltage condition. When the absolute value of the current value Ic is equal to or greater than the open circuit judgment value Ith and the open circuit voltage condition is not satisfied (NO in step S4), the correction control unit 507 confirms the presence/absence of a full charge notification from the charge control unit 501 and confirms a full charge condition (step S5).

Subsequently, when there is no full charge notification from the charge control unit 501 and the full charge condition is not satisfied (NO in step S5), the correction control unit 507 compares a storage ratio RSOCv with a reference value Ref to confirm a reference condition (step S6). When the storage ratio RSOCv and the reference value Ref do not match each other and the reference condition is not satisfied, a transition is made to step S4.

The steps S4 to S6 described above are repeated until any of the open circuit voltage condition, the full charge condition, and the reference condition is satisfied. Subsequently, when the absolute value of the current value Ic becomes smaller than the open circuit judgment value Ith and the open circuit voltage condition is satisfied (YES in step S4), the correction control unit 507 uses the open circuit ratio estimating unit 503 as the first estimating unit and a transition is made to step S7.

Next, the correction control unit 507 stores a quantity of stored electricity Q when the open circuit voltage condition is satisfied as an integrated value Q(1) in, for example, the RAM (step S7).

Subsequently, the open circuit ratio estimating unit 503 estimates a storage ratio RSOCo from the terminal voltage value Vb that is an open circuit voltage (OCV) of the rechargeable battery 4 and the temperature t (step S8). Furthermore, the open circuit ratio estimating unit 503 sets the storage ratio RSOCo as a first storage ratio RSOCa. Since the storage ratio RSOCo expresses the ratio as a percentage, a ratio conversion thereof is set as the first storage ratio Ra (step S9).

In this case, since the open circuit ratio estimating unit 503 estimates the first storage ratio Ra of the rechargeable battery 4 when the open circuit voltage condition is satisfied based on the open circuit voltage of the rechargeable battery 4, the first storage ratio Ra is a highly accurate estimated value of the storage ratio.

Next, in steps S21 to S23, the correction control unit 507 executes processing similar to that of steps S4 to S6. The steps S21 to S23 are repeated until any of the open circuit voltage condition, the full charge condition, and the reference voltage is once again satisfied.

Subsequently, when the absolute value of the current value Ic becomes smaller than the open circuit judgment value Ith and the open circuit voltage condition is satisfied (YES in step S21), the correction control unit 507 uses the open circuit ratio estimating unit 503 as the second estimating unit and a transition is made to step S24.

Next, the correction control unit 507 stores a quantity of stored electricity Q when the open circuit voltage condition is satisfied in step S21 as an integrated value Q(2) in, for example, the RAM (step S24).

Subsequently, the open circuit ratio estimating unit 503 estimates a storage ratio RSOCo from the terminal voltage value Vb that is an open circuit voltage of the rechargeable battery 4 and the temperature t (step S25). Furthermore, the open circuit ratio estimating unit 503 sets the storage ratio RSOCo as a second storage ratio RSOCb. Since the storage ratio RSOCo expresses the ratio as a percentage, a ratio conversion thereof is set as the second storage ratio Rb (step S26).

In this case, since the open circuit ratio estimating unit 503 estimates the second storage ratio Rb of the rechargeable battery 4 when the open circuit voltage condition is satisfied based on the open circuit voltage of the rechargeable battery 4, the second storage ratio Rb is a highly accurate estimated value of the storage ratio.

Next, after correction of the full charge capacity value FCC to be described later, the correction control unit 507 uses the open circuit ratio estimating unit 503 that was used as the second estimating unit as a new first estimating unit in order to prepare for continuing repetitive correction of the full charge capacity value FCC (step S27), and a transition is made to step S41.

Moreover, using as a new first estimating unit does not accompany specific processing and signifies that by using an already-estimated second storage ratio Rb as a first storage ratio Ra in a next correction process, conceptually, an estimating unit already used as a second estimating unit is to be positioned as a first estimating unit in the next correction process.

In step S41, the correction control unit 507 subtracts the integrated value Q(1) from the integrated value Q(2) to calculate a difference integrated value Qd (step S41). Consequently, the difference integrated value Qd becomes an amount of variation of the quantity of stored electricity Q of the rechargeable battery 4 in a period after the rechargeable battery 4 satisfies the open circuit voltage condition in step S4 and until the open circuit voltage condition is once again satisfied in step S21 after charge and discharge.

Next, based on the first storage ratio Ra, the second storage ratio Rb, and the difference integrated value Qd obtained in this manner, the full charge capacity correction unit 508 calculates a full charge capacity value FCCN using the expression (1) (step S42). Subsequently, the full charge capacity correction unit 508 corrects the full charge capacity value FCC by having the full charge capacity value FCCN stored in the capacity storing unit 509 as a new full charge capacity value FCC (step S43).

With the method described in Japanese Patent Application Laid-open No. 2006-177764, since a quantity of stored electricity at start of charge must be calculated based on a full charge capacity prior to correction, there is a disadvantage in that correcting the full charge capacity based on the quantity of stored electricity at start of charge results in a part of an error contained in the full charge capacity prior to correction is to be retained in the full charge capacity after correction.

However, since the expression (1) enables a new full charge capacity value FCCN to be calculated based on the obtained difference integrated value Qd, first storage ratio Ra, and second storage ratio Rb regardless of the full charge capacity prior to correction, a new corrected value does not include an error of the full charge capacity prior to correction. As a result, the full charge capacity correction unit 508 is capable of improving a correction accuracy of the full charge capacity value FCC over the method described in Japanese Patent Application Laid-open No. 2006-177764.

In addition, as described above, since the open circuit ratio estimating unit 503 has a higher estimation accuracy of a storage ratio than the reference ratio estimating unit 506, when the open circuit ratio estimating unit 503 is used as the first and second estimating units in this manner, the estimation accuracy of the full charge capacity value FCC is improved in comparison to a case where any one of the first storage ratio Ra and the second storage ratio Rb is estimated by the reference ratio estimating unit 506.

Subsequently, the correction control unit 507 sets the second storage ratio Rb as the first storage ratio Ra and the integrated value Q(2) is set as the integrated value Q(1) in order to prepare for continuing repetitive correction of the full charge capacity value FCC (step S44), and a transition is once again made to step S21.

Next, the steps S21 to S23 described are repeated by the correction control unit 507 until any of the open circuit voltage condition, the full charge condition, and the reference condition is once again satisfied.

When a full charge notification is made from the charge control unit 501 and the full charge condition is satisfied (YES in step S22), the correction control unit 507 uses the full charge ratio estimating unit 504 as the second estimating unit and a quantity of stored electricity Q when the full charge condition is satisfied is acquired as the integrated value Q(2) (step S28).

Consequently, since the rechargeable battery 4 has been fully charged, the full charge ratio estimating unit 504 estimates that the second storage ratio Rb is "1" and the second storage ratio RSOCb is 100% (step S29). Next, after correction of the full charge capacity value FCC to be described later, the correction control unit 507 sets the full charge ratio estimating unit 504 that had been used as the second estimating unit as a new first estimating unit in order to prepare for continuing repetitive correction of the full charge capacity value FCC (step S30), and a transition is made to step S61.

If the storage ratio RSOCv and the reference value Ref match each other and the reference condition is satisfied when steps S21 to S23 are being repeated (YES in step S23), the correction control unit 507 uses the reference ratio estimating unit 506 as the second estimating unit and a quantity of stored electricity Q when the reference condition is satisfied is acquired as the integrated value Q(2) (step S31).

Consequently, since the storage ratio RSOCv of the rechargeable battery 4 is now equal to the reference value Ref (%), the reference ratio estimating unit 506 assumes the second storage ratio RSOCb as the reference value Ref (%). Since the reference value Ref (%) expresses the ratio as a percentage, a ratio conversion thereof is set as the second storage ratio Rb (step S32).

Subsequently, after correction of the full charge capacity value FCC, the correction control unit 507 uses the reference ratio estimating unit 506 that had been used as the second estimating unit as a new first estimating unit in order to prepare for continuing repetitive correction of the full charge capacity value FCC (step S33), and a transition is made to step S51.

Next, in steps S51 to S54, the same processing as in steps S41 to S44 is executed to correct the full charge capacity value FCC, and the second storage ratio Rb is set as the first storage ratio Ra and the integrated value Q(2) is set as the integrated value Q(1) in order to prepare for continuing repetitive correction of the full charge capacity value FCC, and a transition is made from step S54 to step S61.

In this case, in step S52, the full charge capacity correction unit 508 is capable of improving a correction accuracy of the full charge capacity value FCC over the method described in Japanese Patent Application Laid-open No. 2006-177764 in a similar manner to step S42.

Next, operations of step S61 and thereafter will be described. When a transition has been made to step S61, any one of the full charge ratio estimating unit 504 and the reference ratio estimating unit 506 is used as the first estimating unit or a first estimating unit newly reset as the first estimating unit from the second estimating unit, and satisfying either the full charge condition or the reference condition means that the first storage ratio Ra (including a first storage ratio Ra reset from the second storage ratio Rb) has been estimated.

Therefore, in order to ensure that the open circuit ratio estimating unit 503 is next used as the second estimating unit, step S61 is repeated until the open circuit voltage condition is satisfied. Consequently, when any of the full charge ratio estimating unit 504 and the reference ratio estimating unit 506 is used as the first estimating unit, the open circuit ratio estimating unit 503 is invariably used as the second estimating unit. Therefore, the open circuit ratio estimating unit 503 is adapted so as to be invariably used as at least one of the first estimating unit and the second estimating unit.

Here, since the full charge ratio estimating unit 504 cannot estimate the first storage ratio Ra and the second storage ratio Rb unless the rechargeable battery 4 is fully charged, there are few opportunities to estimate the first storage ratio Ra and the second storage ratio Rb and, therefore, few opportunities to correct the full charge capacity value FCC.

In addition, as described above, the reference ratio estimating unit 506 has a lower estimation accuracy of the first storage ratio Ra and the second storage ratio Rb in comparison to the open circuit ratio estimating unit 503. Therefore, when using the reference ratio estimating unit 506, a correction accuracy of the full charge capacity value FCC decreases. Furthermore, since the reference ratio estimating unit 506 cannot estimate the first storage ratio Ra and the second storage ratio Rb unless the user discharges the rechargeable battery 4 until the storage ratio RSOCv of the rechargeable battery 4 matches the reference value Ref set to, for example, 10% or less, there are few opportunities to estimate the first storage ratio Ra and the second storage ratio Rb and, therefore, few opportunities to correct the full charge capacity value FCC.

On the other hand, the open circuit ratio estimating unit 503 is capable of estimating the first storage ratio Ra and the second storage ratio Rb when the user turns off a power switch of the device or the like and a charge/discharge current of the rechargeable battery 4 substantially becomes 0. Therefore, the open circuit ratio estimating unit 503 has more estimation opportunities of the first storage ratio Ra and the second storage ratio Rb than the full charge ratio estimating unit 504 and the reference ratio estimating unit 506. In addition, the open circuit ratio estimating unit 503 has a higher estimation accuracy of the first storage ratio Ra and the second storage ratio Rb than the reference ratio estimating unit 506.

Therefore, in step S61, by using the open circuit ratio estimating unit 503 as at least one of the first estimating unit and the second estimating unit, correction opportunities of the full charge capacity value FCC can be increased and, at the same time, the correction accuracy of the full charge capacity value FCC can be improved in comparison to a case where the first storage ratio Ra and the second storage ratio Rb are estimated by the reference ratio estimating unit 506.

Subsequently, when an absolute value of the current value Ic becomes smaller than the open circuit judgment value Ith and the open circuit voltage condition is satisfied (YES in step S61), the correction control unit 507 uses the open circuit ratio estimating unit 503 as the second estimating unit and a transition is made to step S62. Thereafter, processing similar to steps S24 to S27 is executed in steps S62 to S65, and processing similar to steps S41 to S44 is executed in steps S66 to S69.

Accordingly, the full charge capacity value FCC is corrected and, at the same time, the second storage ratio Rb is set as the first storage ratio Ra and the integrated value Q(2) is set as the integrated value Q(1) in order to prepare for continuing repetitive correction of the full charge capacity value FCC, and a transition is once again made from step S69 to step S21.

In this case, in step S67, the full charge capacity correction unit 508 is capable of improving a correction accuracy of the full charge capacity value FCC over the method described in Japanese Patent Application Laid-open No. 2006-177764 in a similar manner to step S42.

Moreover, correction of the full charge capacity value FCC need not necessarily be continuously repeated. For example, steps S27 and S44 need not be executed and a transition may be made from step S43 to step S1. In addition, steps S30, S33, and S54 need not be executed and a transition may be made from step S53 to step S1. Furthermore, steps S65 and S69 need not be executed and a transition may be made from step S68 to step S1.

On the other hand, when steps S4 to S6 are being repeated in order to monitor the open circuit voltage condition, the full charge condition, and the reference condition, if a full charge notification is made from the charge control unit 501 and the full charge condition is satisfied (YES in step S5), the correction control unit 507 uses the full charge ratio estimating unit 504 as the first estimating unit and a quantity of stored electricity Q when the full charge condition is satisfied is acquired as the integrated value Q(1) (step S10).

Consequently, since the rechargeable battery 4 has been fully charged, the full charge ratio estimating unit 504 estimates that the first storage ratio Ra is "1" and the first storage ratio RSOCa is 100% (step S11), and a transition is made to step S61.

In addition, if the storage ratio RSOCv and the reference value Ref match each other and the reference condition is satisfied when steps S4 to S6 are being repeated (YES in step S6), the correction control unit 507 uses the reference ratio estimating unit 506 as the first estimating unit and a quantity of stored electricity Q when the reference condition is satisfied is acquired as the integrated value Q(1) (step S12).

Consequently, since the storage ratio RSOCv of the rechargeable battery 4 is equal to the reference value Ref (%), the reference ratio estimating unit 506 takes the first storage ratio RSOCa as the reference value Ref (%). Since the reference value Ref (%) expresses the ratio as a percentage, a ratio conversion thereof is set as the first storage ratio Ra (step S13), and a transition is made to step S61.

Since operations of step S61 and thereafter are the same as described above, a description thereof will be omitted.

FIGS. 9 and 10 are explanatory diagrams for describing a correction method of the full charge capacity value FCC when the open circuit ratio estimating unit 503 is used as the first estimating unit and the full charge ratio estimating unit 504 is used as the second estimating unit. Ordinates in FIGS. 9 and 10 represent an RSOC of the rechargeable battery 4, and abscissas in FIGS. 9 and 10 represent a passage of time. FIG. 9 shows an example of a case where the full charge capacity value FCC is corrected in a negative direction, and FIG. 10 shows an example of a case where the full charge capacity value FCC is corrected in a positive direction.

First, at a point A at a timing T1 in FIG. 9, the open circuit voltage condition is satisfied and the open circuit ratio estimating unit 503 estimates that the first storage ratio Ra is 0.2 (the first storage ratio RSOCa is 20%). At this point, the full charge capacity value FCCO is assumed to be 4000 mAh.

Next, at a timing T2, the full charge condition is satisfied and the full charge ratio estimating unit 504 estimates that the second storage ratio Rb is "1" (the second storage ratio RSOCb is 100%) (point B1). At this point, the difference integrated value Qd is assumed to be 3000 mAh.

Consequently, the full charge capacity value FCCN after correction may be calculated from the expression (1) as $FCCN = 3000 \times 1/(1-0.2) = 3750$ mAh.

On the other hand, calculating the full charge capacity value FCCN using the differential correction method of expressions (2) to (5) results in $QF = 4000 \times 0.2 + 3000 = 3800$ mAh $QS = 4000 \times 1 = 4000$ mAh.

Since Ra<Rb and QF<QS, using the expression (4), $FCCN = 4000 - \{|4000 - 3800| \times (1/|1-0.2|)\} = 3750$ mAh is true.

In FIG. 9, due to the correction of the full charge capacity value FCC at the timing T2, the RSOC calculated by the control unit 50 using the expression (A) (the RSOC notified to the device-side circuit 3) moves from a point B2 to the point B1. Processing for varying the RSOC in accordance with a correction of the full charge capacity value FCC as described above will be referred to as JUMP processing.

Next, referring to FIG. 10, first, a point A at a timing T1 is similar to the point A in FIG. 9. Subsequently, at a timing T2, the full charge condition is satisfied and the full charge ratio estimating unit 504 estimates that the second storage ratio Rb is 1 (the second storage ratio RSOCb is 100%) (point B1). At this point, the difference integrated value Qd is assumed to be 3400 mAh.

Consequently, the full charge capacity value FCCN after correction may be calculated from the expression (1) as $FCCN = 3400 \times 1/(1-0.2) = 4250$ mAh.

On the other hand, calculating the full charge capacity value FCCN using the differential correction method of expressions (2) to (5) results in $QF = 4000 \times 0.2 + 3400 = 4200$ mAh $QS = 4000 \times 1 = 4000$ mAh.

Since Ra<Rb and QF>QS, using the expression (5), $$FCCN=4000+\{|4000-4200|\times(1/|1-0.2|)\}=4250 \text{ mAh}$$

is true.

In FIG. 10, at a timing T3, the RSOC calculated by the control unit 50 using the expression (A) exceeds 100%. However, since the RSOC does not exceed 100% in a normal situation, for a period from the timing T3 to the timing T2, the control unit 50 fixes the RSOC to 100% and notifies the device-side circuit 3. Processing for fixing a value of the RSOC to be notified to the device-side circuit 3 to 100% as described above will be referred to as KEEP processing.

As shown, when using the differential correction method, even though a full charge capacity value FCCO prior to correction is used to calculate a full charge capacity value FCCN, an error contained in the full charge capacity value FCCO is eventually cancelled and the same full charge capacity value FCCN as when using the expression (1) is obtained. Therefore, since a corrected value similar to that of a case where the expression (1) is used can be obtained even when using the differential correction method, the full charge capacity correction unit 508 is capable of improving a correction accuracy of the full charge capacity value FCC over the method described in Japanese Patent Application Laid-open No. 2006-177764.

FIGS. 11 and 12 are explanatory diagrams for describing a correction method of a full charge capacity value FCC when the open circuit ratio estimating unit 503 is used as a first estimating unit and the reference ratio estimating unit 506 is used as a second estimating unit. Ordinates in FIGS. 11 and 12 represent an RSOC of the rechargeable battery 4, and abscissas in FIGS. 11 and 12 represent a passage of time. FIG. 11 shows an example of a case where the full charge capacity value FCC is corrected in a negative direction, and FIG. 12 shows an example of a case where the full charge capacity value FCC is corrected in a positive direction.

First, referring to FIG. 11, at a point C at a timing T4, the open circuit voltage condition is satisfied and the open circuit ratio estimating unit 503 estimates that the first storage ratio Ra is 0.6 (the first storage ratio RSOCa is 60%). The full charge capacity value FCCO is assumed to be 4000 mAh.

Subsequently, at a timing T5, the reference condition is satisfied and the reference ratio estimating unit 506 estimates that the second storage ratio RSOCb is the reference value Ref (=5.5%) and the second storage ratio Rb is Ref/100 (=0.055) (point D1). At this point, the difference integrated value Qd is assumed to be −2000 mAh.

Consequently, the full charge capacity value FCCN after correction may be calculated from the expression (1) as $$FCCN=-2000\times1/(0.055-0.6)=3670 \text{ mAh}.$$

On the other hand, calculating the full charge capacity value FCCN using the differential correction method of expressions (2) to (5) results in $$QF=4000\times0.6-2000=400 \text{ mAh}$$

$$QS=4000\times0.055=220 \text{ mAh}.$$

Since Ra>Rb and QF>QS, using the expression (4), $$FCCN=4000-\{|220-400|\times(1/|0.055-0.6|)\}=3670 \text{ mAh}$$

is true. In FIG. 11, JUMP processing is executed at the timing T5.

Next, referring to FIG. 12, first, a point C at a timing T4 is similar to the point C in FIG. 11. Subsequently, at a timing T5, the reference condition is satisfied and the reference ratio estimating unit 506 estimates that the second storage ratio RSOCb is the reference value Ref (=5.5%) and the second storage ratio Rb is Ref/100 (=0.055) (point D1). At this point, the difference integrated value Qd is assumed to be −2360 mAh.

Consequently, the full charge capacity value FCCN after correction may be calculated from the expression (1) as $$FCCN=-2360\times1/(0.055-0.6)=4330 \text{ mAh}.$$

On the other hand, calculating the full charge capacity value FCCN using the differential correction method of expressions (2) to (5) results in $$QF=4000\times0.6-2360=40 \text{ mAh}$$

$$QS=4000\times0.055=220 \text{ mAh}.$$

Since Ra>Rb and QF<QS, using the expression (5), $$FCCN=4000+\{|220-40|\times(1/|0.055-0.6|)\}=4330 \text{ mAh}$$

is true. In FIG. 12, KEEP processing is executed at the timings T6 to T5.

As shown, since a corrected value similar to that of a case where the expression (1) is used can be obtained even by using the differential correction method when the open circuit ratio estimating unit 503 is used as the first estimating unit and the reference ratio estimating unit 506 is used as the second estimating unit, the full charge capacity correction unit 508 is capable of improving a correction accuracy of the full charge capacity value FCC over the method described in Japanese Patent Application Laid-open No. 2006-177764.

FIGS. 13 and 14 are explanatory diagrams for describing a correction method of a full charge capacity value FCC when the open circuit ratio estimating unit 503 is used as the first and second estimating units. Ordinates in FIGS. 13 and 14 represent an RSOC of the rechargeable battery 4, and abscissas in FIGS. 13 and 14 represent a passage of time. FIG. 13 shows an example of a case where the full charge capacity value FCC is corrected in a negative direction, and FIG. 14 shows an example of a case where the full charge capacity value FCC is corrected in a positive direction.

First, at a point E at a timing T7, the open circuit voltage condition is satisfied and the open circuit ratio estimating unit 503 estimates that the first storage ratio Ra is 0.6 (the first storage ratio RSOCa is 60%). The full charge capacity value FCCO is assumed to be 4000 mAh.

Next, at a timing T8, the open circuit voltage condition is satisfied and the open circuit ratio estimating unit 503 estimates that the second storage ratio Rb is 0.1 (the second storage ratio RSOCb is 10%) (point F1). At this point, the difference integrated value Qd is assumed to be −1800 mAh.

Consequently, the full charge capacity value FCCN after correction may be calculated from the expression (1) as $$FCCN=-1800\times11(0.1-0.6)=3600 \text{ mAh}.$$

On the other hand, calculating the full charge capacity value FCCN using the differential correction method of expressions (2) to (5) results in $$QF=4000\times0.6-1800=600 \text{ mAh}$$

$$QS=4000\times0.1=400 \text{ mAh}.$$

Since Ra>Rb and QF>QS, using the expression (4), $$FCCN=4000-\{|400-600|\times(1/|0.1-0.6|)\}=3600 \text{ mAh}$$

is true. In FIG. 13, JUMP processing is executed at the timing T8.

Next, referring to FIG. 14, first, a point E at a timing T7 is similar to the point E in FIG. 13. Next, at a timing T8, the open circuit voltage condition is satisfied and the open circuit ratio estimating unit 503 estimates that the second storage ratio Rb is 0.1 (the second storage ratio RSOCb is 10%) (point F1). At this point, the difference integrated value Qd is assumed to be −2200 mAh.

Consequently, the full charge capacity value FCCN after correction may be calculated from the expression (1) as FCCN=−2200×11(0.1−0.6)=4400 mAh.

On the other hand, calculating the full charge capacity value FCCN using the differential correction method of expressions (2) to (5) results in QF=4000×0.6−2200=200 mAh QS=4000×0.1=400 mAh.

Since Ra>Rb and QF<QS, using the expression (5),

FCCN=4000+{|400−200|×(1/|0.1−0.6|)}=4400 mAh is true. In FIG. 14, JUMP processing is executed at the timing T8.

As shown, since a corrected value similar to that of a case where the expression (1) is used can be obtained even by using the differential correction method when the open circuit ratio estimating unit 503 is used as the first and second estimating units, the full charge capacity correction unit 508 is capable of improving a correction accuracy of the full charge capacity value FCC over the method described in Japanese Patent Application Laid-open No. 2006-177764.

Moreover, while an example where the open circuit ratio estimating unit 503, the full charge ratio estimating unit 504, and the reference ratio estimating unit 506 are provided as estimating units has been described, the open circuit ratio estimating unit 503 and the full charge ratio estimating unit 504 may be provided without the reference ratio estimating unit 506, whereby the open circuit ratio estimating unit 503 is used as one of the first estimating unit and the second estimating unit and the full charge ratio estimating unit 504 is used as the other one of the first estimating unit and second estimating unit.

In addition, the open circuit ratio estimating unit 503 and the reference ratio estimating unit 506 may be provided without the full charge ratio estimating unit 504, whereby the open circuit ratio estimating unit 503 is used as one of the first estimating unit and second estimating unit and the reference ratio estimating unit 506 is used as the other one of the first estimating unit and second estimating unit.

Furthermore, the full charge ratio estimating unit 504 and the reference ratio estimating unit 506 need not be provided, whereby the open circuit ratio estimating unit 503 may used as the first estimating unit and the second estimating unit.

Moreover, the estimating unit used in combination with the open circuit ratio estimating unit 503 is not limited to the full charge ratio estimating unit 504 and the reference ratio estimating unit 506, and a storage ratio of the rechargeable battery 4 may be estimated by other methods.

That is, a full charge capacity correction circuit according to an aspect of the present invention includes: an integrating unit that calculates an integrated value by integrating a current value of a current flowing through a rechargeable battery; a capacity storing unit that stores a full charge capacity value that indicates a full charge capacity of the rechargeable battery; a first estimating unit that estimates a storage ratio of the rechargeable battery, which is a ratio of a quantity of stored electricity that is stored in the rechargeable battery to an actual full charge capacity of the rechargeable battery, as a first storage ratio when an estimable condition which is a condition that enables to estimate the storage ratio is satisfied; a second estimating unit that monitors whether or not the estimable condition which is a condition that enables to estimate the storage ratio is satisfied after the first storage ratio is estimated by the first estimating unit, and when the estimable condition is satisfied, estimates the storage ratio of the rechargeable battery at that moment as a second storage ratio; a full charge capacity correction unit that estimates a full charge capacity value of the rechargeable battery based on a difference integrated value that is an integrated value integrated by the integrating unit after the first storage ratio is estimated by the first estimating unit and until the second storage ratio is estimated by the second estimating unit and on a ratio of a difference between the first storage ratio and the second storage ratio to 1, and corrects the full charge capacity value by having the capacity storing unit store the estimated full charge capacity value as a new full charge capacity value; an open circuit ratio estimating unit that uses, as the estimable condition, an open circuit voltage condition which requires a current flowing through the rechargeable battery to fall below an open circuit judgment value set in advance in order to judge that a state exists where an open circuit voltage can be obtained as a terminal voltage of the rechargeable battery, and when the open circuit voltage condition is satisfied, estimates the storage ratio of the rechargeable battery based on the terminal voltage of the rechargeable battery; and a correction control unit that sets the open circuit ratio estimating unit as at least one of the first estimating unit and the second estimating unit.

According to this configuration, when the estimable condition that is a condition under which the storage ratio of the rechargeable battery becomes estimable is satisfied, the first estimating unit estimates the storage ratio of the rechargeable battery as a first storage ratio. In addition, after the first storage ratio is estimated by the first estimating unit, the second estimating unit monitors whether or not an estimable condition that is either the same or different from the estimated condition is satisfied, and when the estimable condition is satisfied, the storage ratio of the rechargeable battery at that point is estimated as a second storage ratio.

In this case, a difference between the first storage ratio and the second storage ratio is caused by a quantity of electricity corresponding to the difference integrated value. In addition, a full charge capacity value corresponds to a ratio of "1" or, in other words, 100%. Therefore, the full charge capacity correction unit is capable of estimating the full charge capacity value of the rechargeable battery based on a ratio of a difference between the first storage ratio and the second storage ratio to 1 that is a ratio corresponding to a full charge capacity value and on the difference integrated value. By estimating the full charge capacity value after correction in this manner, the full charge capacity correction unit is capable of correcting the full charge capacity value without being influenced by an error included in the full charge capacity value prior to correction. As a result, a correction accuracy of the full charge capacity can be improved over the method described in Japanese Patent Application Laid-open No. 2006-177764.

Furthermore, the open circuit ratio estimating unit estimates the storage ratio of the rechargeable battery based on a terminal voltage of the rechargeable battery when the open circuit voltage condition is satisfied or, in other words, based on the open circuit voltage of the rechargeable battery. The open circuit voltage of the rechargeable battery is an electromotive force itself of the rechargeable battery, and since the electromotive force of a rechargeable battery is determined in accordance with a storage ratio of the rechargeable battery, the open circuit ratio estimating unit that estimates the storage ratio based on the open circuit voltage is capable of estimating the storage ratio of the second battery with accuracy. In addition, an open circuit voltage condition in which a current flowing through the rechargeable battery falls below an open circuit judgment value is likely to be satisfied when, for example, the user turns off a switch of a device that uses the rechargeable battery. Therefore, there are conceivably more opportunities for the open circuit voltage condition to be satisfied than opportunities for the rechargeable battery to be fully charged or fully discharged.

In consideration thereof, by having the correction control unit set the open circuit ratio estimating unit which requires that the open circuit voltage condition be satisfied to be used as at least one of the first estimating unit and the second estimating unit, estimation opportunities of the storage ratio can be increased. By increasing the estimation opportunities of the storage ratio, correction opportunities of the full charge capacity can be increased. Consequently, a correction accuracy of the full charge capacity can be improved over the method described in Japanese Patent Application Laid-open No. 2006-177764 while increasing correction opportunities of the full charge capacity.

In addition, favorably, a full charge detecting unit which detects that the rechargeable battery is fully charged; and a full charge ratio estimating unit which uses a full charge condition that requires a full charge of the rechargeable battery to be detected by the full charge detecting unit as the estimable condition, and which estimates that the storage ratio of the rechargeable battery is 1 when the full charge condition is satisfied are further provided, wherein the correction control unit sets the open circuit ratio estimating unit as one of the first estimating unit and the second estimating unit, and sets the full charge ratio estimating unit as the other one of the first estimating unit and the second estimating unit.

According to this configuration, the full charge detecting unit detects that the rechargeable battery has been fully charged. This means that when the full charge condition is satisfied, the storage ratio of the rechargeable battery is almost certainly 1 (100%). Therefore, by estimating that the storage ratio of the rechargeable battery is 1 (100%) when the full charge condition is satisfied, the full charge ratio estimating unit is capable of estimating the storage ratio with extremely high accuracy.

In this case, by having the correction control unit use the open circuit ratio estimating unit as one of the first estimating unit and the second estimating unit and use the full charge ratio estimating unit as the other one of the first estimating unit and the second estimating unit, since the full charge ratio estimating unit whose estimation accuracy of the charge ratio is extremely high and the open circuit ratio estimating unit that has more estimation opportunities of the storage ratio than the full charge ratio estimating unit are used in combination to correct the full charge capacity, a good balance between improving correction accuracy and increasing correction opportunities can be readily achieved.

Furthermore, favorably, a voltage conversion rate acquiring unit which acquires a storage ratio of the rechargeable battery based on the terminal voltage of the rechargeable battery; and a reference ratio estimating unit which uses, as the estimable condition, a reference condition that requires the storage ratio acquired by the voltage conversion rate acquiring unit to equal a reference value set in advance, and which estimates that the storage ratio of the rechargeable battery is the reference value when the reference condition is satisfied are further provided, wherein the correction control unit sets the open circuit ratio estimating unit as one of the first estimating unit and the second estimating unit, and sets the reference ratio estimating unit as the other one of the first estimating unit and the second estimating unit.

A terminal voltage of a rechargeable battery varies according to a storage ratio. The voltage conversion rate acquiring unit uses this property to acquire a storage ratio based on the terminal voltage of the rechargeable battery. In addition, when the storage ratio acquired by the voltage conversion rate acquiring unit matches the reference value, since the storage ratio of the rechargeable battery is equal to the reference value, the reference ratio estimating unit can estimate the storage ratio of the rechargeable battery by adopting the reference value without modification as the storage ratio of the rechargeable battery. Consequently, by appropriately setting the reference value to a storage ratio that differs from a full charge or a full discharge, estimation opportunities of the storage ratio increases because the storage ratio of the rechargeable battery can be estimated without performing a full charge or a full discharge.

In this case, by having the correction control unit use the open circuit ratio estimating unit as one of the first estimating unit and the second estimating unit and use the reference ratio estimating unit as the other one of the first estimating unit and the second estimating unit, since the reference ratio estimating unit that has many estimation opportunities of the storage ratio and the open circuit ratio estimating unit whose estimation accuracy of the charge ratio is higher than the reference ratio estimating unit and which has more estimation opportunities of the storage ratio than the full charge ratio estimating unit are used in combination to correct the full charge capacity, a good balance between improving correction accuracy and increasing correction opportunities can be readily achieved.

Moreover, favorably, a full charge detecting unit which detects that the rechargeable battery is fully charged; and a full charge ratio estimating unit which uses a full charge condition that requires a full charge of the rechargeable battery to be detected by the full charge detecting unit as the estimable condition, and which estimates that the storage ratio of the rechargeable battery is 1 when the full charge condition is satisfied; a voltage conversion rate acquiring unit which acquires the storage ratio of the rechargeable battery based on the terminal voltage of the rechargeable battery; and a reference ratio estimating unit which uses, as the estimable condition, a reference condition that requires the storage ratio acquired by the voltage conversion rate acquiring unit to equal a reference value set in advance, and which estimates that the storage ratio of the rechargeable battery is the reference value when the reference condition is satisfied are further provided, wherein when any one of the open circuit voltage condition, the full charge condition, and the reference condition is satisfied, the correction control unit sets the estimating unit that uses the satisfied condition as the estimable condition as the first estimating unit, when the open circuit ratio estimating unit is set as the first estimating unit, the correction control unit sets any one of the open circuit ratio estimating unit, the full charge ratio estimating unit, and the reference ratio estimating unit as the second estimating unit, and when any one of the full charge ratio estimating unit and the reference ratio estimating unit is set as the first estimating unit, the correction control unit sets the open circuit ratio estimating unit as the second estimating unit.

According to this configuration, when any of the open circuit voltage condition, the full charge condition, and the reference condition is satisfied, since the correction control unit uses the estimating unit that uses the satisfied condition as an estimable condition as the first estimating unit, estimation opportunities of the storage ratio increase. In addition, when the correction control unit uses the open circuit ratio estimating unit as the first estimating unit, any estimating unit of the open circuit ratio estimating unit, the full charge ratio estimating unit, and the reference ratio estimating unit is used as the second estimating unit, and when the correction control unit uses any estimating unit of the full charge ratio estimating unit and the reference ratio estimating unit as the first estimating unit, the correction control unit uses the open circuit ratio estimating unit as the second estimating unit. As a result, since the open circuit ratio estimating unit whose estimation accuracy of the charge ratio is higher than the reference ratio estimating unit and which has more estimation opportunities of the storage ratio than the full charge ratio estimating unit is used as at least one of the first and second estimating units, a good balance between improving correction accuracy and increasing correction opportunities can be readily achieved.

Furthermore, favorably, when the second storage ratio is estimated by the second estimating unit and a new full charge capacity value is stored in the capacity storing unit by the full charge capacity correction unit, the correction control unit newly sets the estimating unit that used as the second estimating unit as the first estimating unit, and by setting the estimated second storage ratio as the first storage ratio, the correction control unit assumes that a new first storage ratio has been estimated and sets the new second estimating unit.

According to this configuration, after the full charge capacity value is corrected, the correction control unit uses the second storage ratio used to correct the full charge capacity value as the first storage ratio for a next correction. Consequently, the first storage ratio need not be re-estimated when an estimable condition is next satisfied, and by estimating the second storage ratio when a predetermined estimable condition is next satisfied and once again correcting the full charge capacity value, correction of the full charge capacity value can be continuously repeated. As a result, correction opportunities of the full charge capacity value can be increased.

Moreover, favorably, the full charge capacity correction unit calculates the new full charge capacity value by multiplying the difference integrated value with an inverse of a subtracted value obtained by subtracting the second storage ratio from the first storage ratio.

According to this configuration, since the full charge capacity correction unit is capable of calculating a new full charge capacity value without using the full charge capacity value prior to correction, the full charge capacity value can be corrected without being influenced by an error contained in the full charge capacity value prior to correction. As a result, the correction accuracy of the full charge capacity value can be improved.

In addition, favorably, if Ra denotes the first storage ratio, Rb denotes the second storage ratio, and Qd denotes the difference integrated value, then the full charge capacity correction unit calculates the new full charge capacity value FCCN according to an expression (1) below.

$$\text{Full charge capacity value } FCCN = Qd \times 1/(Rb-Ra) \quad (1)$$

According to this configuration, since the full charge capacity correction unit is capable of calculating a new full charge capacity value using the expression (1) which does not contain the full charge capacity value prior to correction, the full charge capacity value can be corrected without being influenced by an error contained in the full charge capacity value prior to correction. As a result, the correction accuracy of the full charge capacity value can be improved.

Furthermore, the full charge capacity correction unit may be configured such that if FCCO denotes the full charge capacity value prior to correction stored in the capacity storing unit, Ra denotes the first storage ratio, Rb denotes the second storage ratio, and Qd denotes the difference integrated value, the full charge capacity correction unit acquires a first quantity of electricity QF that satisfies an expression (2) below and a second quantity of electricity QS that satisfies an expression (3) below, and at the same time, when Ra<Rb and QF<QS, the full charge capacity correction unit calculates the new full charge capacity value FCCN based on an expression (4) below, when Ra<Rb and QF>QS, the full charge capacity correction unit calculates the new full charge capacity value FCCN based on an expression (5) below, when Ra>Rb and QF<QS, the full charge capacity correction unit calculates the new full charge capacity value FCCN based on the expression (5) below, and when Ra>Rb and QF>QS, the full charge capacity correction unit calculates the new full charge capacity value FCCN based on the expression (4) below.

$$QF = FCCO \times Ra + Qd \quad (2)$$

$$QS = FCCO \times Rb \quad (3)$$

$$FCCN = FCCO - \{|QS-QF| \times (1/|Rb-Ra|)\} \quad (4)$$

$$FCCN = FCCO + \{|QS-QF| \times (1/|Rb-Ra|)\} \quad (5).$$

According to this configuration, while the full charge capacity value FCCO prior to correction is used during the calculation of the full charge capacity value FCCN, the influence of the full charge capacity value FCCO is eventually cancelled and a similar result as a case where the full charge capacity value FCCN is calculated using the expression (1) can be obtained.

Moreover, favorably, when the first storage ratio Ra is estimated by the first estimating unit, the full charge capacity correction unit updates the integrated value integrated by the integrating unit to a product of the full charge capacity value FCCO and the first storage ratio Ra, and the full charge capacity correction unit acquires, as the first quantity of electricity QF, the integrated value of the integrating unit when the second storage ratio Rb is estimated by the second estimating unit by having the integrating unit continue subsequent integration with respect to the updated product.

When the first storage ratio Ra is estimated by the first estimating unit, the full charge capacity correction unit updates the integrated value integrated by the integrating unit to a product of the full charge capacity value FCCO and the first storage ratio Ra, and causes the integrating unit to continue subsequent integration with respect to the updated product. Consequently, the integrated value integrated by the integrating unit becomes, without modification, the first quantity of electricity QF that satisfies the expression (2). Therefore, since the first quantity of electricity QF can be obtained without having to perform the arithmetic processing of the expression (2), arithmetic processing can be simplified.

In addition, favorably, the storage ratio has a first range in which the terminal voltage of the rechargeable battery varies with respect to a variation of the storage ratio and a second range in which the variation of the terminal voltage of the rechargeable battery with respect to a variation of the storage ratio is smaller than in the first range, and a value selected from the storage ratios belonging to the first range is set as the reference value.

According to this configuration, a value selected from storage ratios belonging to the first range in which a variation of the terminal voltage with respect to a variation of the storage ratio is greater than in the second range is set as the reference value that is used by the reference ratio estimating unit. Consequently, since the storage ratio acquired based on the terminal voltage matches the reference value in a region where the terminal voltage varies significantly with respect to a variation in the storage ratio, a judgment accuracy of the reference condition improves. Since the reference ratio estimating unit estimates that the storage ratio of the rechargeable battery is the reference value when the reference condition is satisfied, an improvement in the judgment accuracy of the reference condition results in an improvement in the estimation accuracy of the storage ratio by the reference ratio estimating unit and, in turn, in an improvement in the correction accuracy of the full charge capacity value.

Furthermore, favorably, the rechargeable battery is a lithium-ion rechargeable battery, and the reference value is set to a value equal to or less than 10%.

A region of a lithium-ion rechargeable battery where SOC is equal to or lower than 10% corresponds to the first range. Therefore, by setting the reference value to a value equal to or less than 10%, the correction accuracy of the full charge capacity value can be improved.

Moreover, favorably, a current detecting unit that detects a current value of a current flowing through the rechargeable battery; a voltage detecting unit that detects the terminal voltage of the rechargeable battery; a temperature detecting unit that detects a temperature of the rechargeable battery; and a table storing unit that stores a look-up table which associates a storage ratio of the rechargeable battery, a current value flowing through the rechargeable battery, and a temperature of the rechargeable battery with a terminal voltage of the rechargeable battery are further provided, wherein the voltage conversion rate acquiring unit acquires a storage ratio associated by the look-up table stored in the table storing unit with the terminal voltage detected by the voltage detecting unit, a current value detected by the current detecting unit, and a temperature detected by the temperature detecting unit.

According to this configuration, since the storage ratio of the rechargeable battery and the terminal voltage value, the current value, and the temperature which are correlated to the storage ratio are associated with each other by the look-up table, by using the terminal voltage detected by the voltage detecting unit, the current value detected by the current detecting unit, and the temperature detected by the temperature detecting unit, the voltage conversion rate acquiring unit can readily acquire the storage ratio of the rechargeable battery while reducing the influences of the current value flowing through the rechargeable battery and the temperature of the rechargeable battery.

In addition, a charging system according to an aspect of the present invention includes: the full charge capacity correction circuit described above; and a charging unit that performs charging by applying a full charge voltage of the rechargeable battery to the rechargeable battery, wherein the full charge detecting unit judges that the rechargeable battery is fully charged when a current flowing through the rechargeable during charging by the charging unit falls below a judgment threshold set in advance.

According to this configuration, the rechargeable battery is judged to be fully charged when a current flowing through the rechargeable battery during charging by the charging unit falls below a judgment threshold set in advance or, in other words, when a charge completion condition of the rechargeable battery is satisfied. Therefore, the full charge detecting unit can detect that the rechargeable battery has been fully charged with high accuracy.

Furthermore, a battery pack according to an aspect of the present invention includes: the full charge capacity correction circuit described above; and the rechargeable battery.

According to this configuration, with a battery pack comprising the rechargeable battery, a correction accuracy of the full charge capacity can be improved over the method described in Japanese Patent Application Laid-open No. 2006-177764 while increasing the correction opportunities of the full charge capacity.

Moreover, a full charge capacity correction method according to an aspect of the present invention includes: an integrating step of calculating an integrated value by integrating a current value of a current flowing through a rechargeable battery; a first estimating step of estimating a storage ratio of the rechargeable battery, which is a ratio of a quantity of stored electricity that is stored in the rechargeable battery to an actual full charge capacity of the rechargeable battery, as a first storage ratio when an estimable condition which is a condition that enables to estimate the storage ratio is satisfied; a second estimating step of monitoring whether or not the estimable condition which is a condition that enables to estimate the storage ratio is satisfied after the first storage ratio is estimated in the first estimating step, and when the estimable condition is satisfied, estimating the storage ratio of the rechargeable battery at that moment as a second storage ratio; a full charge capacity correction step of estimating a full charge capacity value of the rechargeable battery based on a difference integrated value that is an integrated value integrated in the integrating step after the first storage ratio is estimated in the first estimating step and until the second storage ratio is estimated in the second estimating step and on a ratio of a difference between the first storage ratio and the second storage ratio to 1, and correcting the full charge capacity value by setting the estimated full charge capacity value as a new full charge capacity value; an open circuit ratio estimating step of using, as the estimable condition, an open circuit voltage condition which requires a current flowing through the rechargeable battery to fall below an open circuit judgment value set in advance in order to judge that a state exists where an open circuit voltage can be obtained as a terminal voltage of the rechargeable battery, and when the open circuit voltage condition is satisfied, estimating the storage ratio of the rechargeable battery based on the terminal voltage of the rechargeable battery; wherein the open circuit ratio estimating step is used as at least one of the first estimating step and the second estimating step.

According to this configuration, in the same manner as the full charge capacity correction circuit described earlier, a correction accuracy of the full charge capacity can be improved over the method described in Japanese Patent Application Laid-open No. 2006-177764 while increasing the correction opportunities of the full charge capacity.

A full charge capacity correction circuit, a charging system, a battery pack, and a full charge capacity correction method configured as described above are capable of improving calculation accuracy of a full charge capacity over the method described in Japanese Patent Application Laid-open No. 2006-177764 while increasing correction opportunities of the full charge capacity.

Moreover, it is to be understood that the specific embodiments and examples devised in the modes for implementing the present invention are solely for clarifying the technical contents of the present invention. As such, the present invention is not to be narrowly interpreted to such specific embodiments and examples, and various changes may be made without departing from the spirit of the present invention and the scope of the following claims.

The full charge capacity correction circuit, the charging system, the battery pack, and the full charge capacity correction method according to the present invention can be suitably used in electronic devices such as a mobile personal computer, a digital camera, a video camera and a mobile phone, vehicles such as an electric car and a hybrid car, hybrid elevators, power systems combining a photovoltaic cell or a power-generating device with a rechargeable battery, and battery-mounted devices and systems such as uninterruptible power source equipment.

What is claimed is:

1. A full charge capacity correction circuit comprising:
   an integrating unit that calculates an integrated value by integrating a current value of a current flowing through a rechargeable battery;
   a capacity storing unit that stores a full charge capacity value that indicates a full charge capacity of the rechargeable battery;
   a first estimating unit that estimates a storage ratio of the rechargeable battery, which is a ratio of a quantity of stored electricity that is stored in the rechargeable battery to an actual full charge capacity of the rechargeable battery, as a first storage ratio when an estimable condition which is a condition that enables to estimate the storage ratio is satisfied;
   a second estimating unit that monitors whether or not the estimable condition which is a condition that enables to estimate the storage ratio is satisfied after the first storage ratio is estimated by the first estimating unit, and when the estimable condition is satisfied, estimates the storage ratio of the rechargeable battery at that moment as a second storage ratio;
   a full charge capacity correction unit that estimates a full charge capacity value of the rechargeable battery based on a difference integrated value that is an integrated value integrated by the integrating unit after the first storage ratio is estimated by the first estimating unit and until the second storage ratio is estimated by the second estimating unit and on a ratio of a difference between the first storage ratio and the second storage ratio to 1, and corrects the full charge capacity value by having the capacity storing unit store the estimated full charge capacity value as a new full charge capacity value;
   an open circuit ratio estimating unit that uses, as the estimable condition, an open circuit voltage condition which requires a current flowing through the rechargeable battery to fall below an open circuit judgment value set in advance in order to judge that a state exists where an open circuit voltage can be obtained as a terminal voltage of the rechargeable battery, and when the open circuit voltage condition is satisfied, estimates the storage ratio of the rechargeable battery based on the terminal voltage of the rechargeable battery; and
   a correction control unit that uses the open circuit ratio estimating unit as at least one of the first estimating unit and the second estimating unit.

2. The full charge capacity correction circuit according to claim 1, further comprising:
   a full charge detecting unit which detects that the rechargeable battery is fully charged; and
   a full charge ratio estimating unit which uses a full charge condition that requires a full charge of the rechargeable battery to be detected by the full charge detecting unit as the estimable condition, and which estimates that the storage ratio of the rechargeable battery is 1 when the full charge condition is satisfied, wherein
   the correction control unit uses the open circuit ratio estimating unit as one of the first estimating unit and the second estimating unit, and uses the full charge ratio estimating unit as the other one of the first estimating unit and the second estimating unit.

3. The full charge capacity correction circuit according to claim 1, further comprising:
   a voltage conversion rate acquiring unit which acquires a storage ratio of the rechargeable battery based on the terminal voltage of the rechargeable battery; and
   a reference ratio estimating unit which uses, as the estimable condition, a reference condition that requires the storage ratio acquired by the voltage conversion rate acquiring unit to equal a reference value set in advance, and which estimates that the storage ratio of the rechargeable battery is the reference value when the reference condition is satisfied, wherein
   the correction control unit uses the open circuit ratio estimating unit as one of the first estimating unit and the second estimating unit, and uses the reference ratio estimating unit as the other one of the first estimating unit and the second estimating unit.

4. The full charge capacity correction circuit according to claim 1, further comprising:
   a full charge detecting unit which detects that the rechargeable battery is fully charged;
   a full charge ratio estimating unit which uses a full charge condition that requires a full charge of the rechargeable battery to be detected by the full charge detecting unit as the estimable condition, and which estimates that the storage ratio of the rechargeable battery is 1 when the full charge condition is satisfied;
   a voltage conversion rate acquiring unit which acquires a storage ratio of the rechargeable battery based on the terminal voltage of the rechargeable battery; and
   a reference ratio estimating unit which uses, as the estimable condition, a reference condition that requires the storage ratio acquired by the voltage conversion rate acquiring unit to equal a reference value set in advance, and which estimates that the storage ratio of the rechargeable battery is the reference value when the reference condition is satisfied, wherein
   when any one of the open circuit voltage condition, the full charge condition, and the reference condition is satisfied, the correction control unit uses the estimating unit that uses the satisfied condition as the estimable condition as the first estimating unit, when the open circuit ratio estimating unit is used as the first estimating unit, the correction control unit uses any one of the open circuit ratio estimating unit, the full charge ratio estimating unit, and the reference ratio estimating unit as the second estimating unit, and when any one of the full charge ratio estimating unit and the reference ratio estimating unit is used as the first estimating unit, the correction control unit uses the open circuit ratio estimating unit as the second estimating unit.

5. The full charge capacity correction circuit according to claim 1, wherein
   when the second storage ratio is estimated by the second estimating unit and a new full charge capacity value is stored in the capacity storing unit by the full charge capacity correction unit, the correction control unit newly uses the estimating unit used as the second estimating unit as the first estimating unit, and by setting the estimated second storage ratio as the first storage ratio, the correction control unit assumes that a new first storage ratio has been estimated and sets the new second estimating unit.

6. The full charge capacity correction circuit according to claim 1, wherein
the full charge capacity correction unit calculates the new full charge capacity value by multiplying the difference integrated value with an inverse of a subtracted value obtained by subtracting the second storage ratio from the first storage ratio.

7. The full charge capacity correction circuit according to claim 6, wherein
if Ra denotes the first storage ratio, Rb denotes the second storage ratio, and Qd denotes the difference integrated value, then the full charge capacity correction unit calculates the new full charge capacity value FCCN according to an expression (1) below:

Full charge capacity value $FCCN = Qd \times 1/(Rb-Ra)$  (1).

8. The full charge capacity correction circuit according to claim 1, wherein
if FCCO denotes the full charge capacity value prior to correction stored in the capacity storing unit, Ra denotes the first storage ratio, Rb denotes the second storage ratio, and Qd denotes the difference integrated value, the full charge capacity correction unit acquires a first quantity of electricity QF that satisfies an expression (2) below and a second quantity of electricity QS that satisfies an expression (3) below, and at the same time, when Ra<Rb and QF<QS, the full charge capacity correction unit calculates the new full charge capacity value FCCN based on an expression (4) below, when Ra<Rb and QF>QS, the full charge capacity correction unit calculates the new full charge capacity value FCCN based on an expression (5) below, when Ra>Rb and QF<QS, the full charge capacity correction unit calculates the new full charge capacity value FCCN based on the expression (5) below, and when Ra>Rb and QF>QS, the full charge capacity correction unit calculates the new full charge capacity value FCCN based on the expression (4) below:

$QF = FCCO \times Ra + Qd$  (2)

$QS = FCCO \times Rb$  (3)

$FCCN = FCCO - \{|QS-QF| \times (1/|Rb-Ra|)\}$  (4)

$FCCN = FCCO + \{|QS-QF| \times (1/|Rb-Ra|)\}$  (5).

9. The full charge capacity correction circuit according to claim 8, wherein
when the first storage ratio Ra is estimated by the first estimating unit, the full charge capacity correction unit updates the integrated value integrated by the integrating unit to a product of the full charge capacity value FCCO and the first storage ratio Ra, and the full charge capacity correction unit acquires, as the first quantity of electricity QF, the integrated value of the integrating unit when the second storage ratio Rb is estimated by the second estimating unit by having the integrating unit continue subsequent integration with respect to the updated product.

10. The full charge capacity correction circuit according to claim 3, wherein
the storage ratio has a first range in which the terminal voltage of the rechargeable battery varies with respect to a variation of the storage ratio and a second range in which the variation of the terminal voltage of the rechargeable battery with respect to the variation of the storage ratio is smaller than in the first range, and
a value selected from the storage ratios belonging to the first range is set as the reference value.

11. The full charge capacity correction circuit according to claim 4, wherein
the storage ratio has a first range in which the terminal voltage of the rechargeable battery varies with respect to a variation of the storage ratio and a second range in which the variation of the terminal voltage of the rechargeable battery with respect to the variation of the storage ratio is smaller than in the first range, and
a value selected from the storage ratios belonging to the first range is set as the reference value.

12. The full charge capacity correction circuit according to claim 10, wherein
the rechargeable battery is a lithium-ion rechargeable battery, and
the reference value is set to a value equal to or less than 10%.

13. The full charge capacity correction circuit according to claim 3, further comprising:
a current detecting unit that detects a current value of a current flowing through the rechargeable battery;
a voltage detecting unit that detects the terminal voltage of the rechargeable battery;
a temperature detecting unit that detects a temperature of the rechargeable battery; and
a table storing unit that stores a look-up table which associates a storage ratio of the rechargeable battery, a current value flowing through the rechargeable battery, and a temperature of the rechargeable battery with a terminal voltage of the rechargeable battery, wherein
the voltage conversion rate acquiring unit acquires a storage ratio associated by the look-up table stored in the table storing unit with the terminal voltage detected by the voltage detecting unit, a current value detected by the current detecting unit, and a temperature detected by the temperature detecting unit.

14. The full charge capacity correction circuit according to claim 4, further comprising:
a current detecting unit that detects a current value of a current flowing through the rechargeable battery;
a voltage detecting unit that detects the terminal voltage of the rechargeable battery;
a temperature detecting unit that detects a temperature of the rechargeable battery; and
a table storing unit that stores a look-up table which associates a storage ratio of the rechargeable battery, a current value flowing through the rechargeable battery, and a temperature of the rechargeable battery with a terminal voltage of the rechargeable battery, wherein
the voltage conversion rate acquiring unit acquires a storage ratio associated by the look-up table stored in the table storing unit with the terminal voltage detected by the voltage detecting unit, a current value detected by the current detecting unit, and a temperature detected by the temperature detecting unit.

15. A charging system comprising:
the full charge capacity correction circuit according to claim 2; and
a charging unit that performs charging by applying a full charge voltage of the rechargeable battery to the rechargeable battery, wherein
the full charge detecting unit judges that the rechargeable battery is fully charged when a current flowing through the rechargeable during charging by the charging unit falls below a judgment threshold set in advance.

16. A charging system comprising:
the full charge capacity correction circuit according to claim 3; and
a charging unit that performs charging by applying a full charge voltage of the rechargeable battery to the rechargeable battery, wherein
the full charge detecting unit judges that the rechargeable battery is fully charged when a current flowing through the rechargeable during charging by the charging unit falls below a judgment threshold set in advance.

17. A battery pack comprising:
the full charge capacity correction circuit according to claim 1; and
the rechargeable battery.

18. A full charge capacity correction method comprising:
an integrating step of calculating an integrated value by integrating a current value of a current flowing through a rechargeable battery;
a first estimating step of estimating a storage ratio of the rechargeable battery, which is a ratio of a quantity of stored electricity that is stored in the rechargeable battery to an actual full charge capacity of the rechargeable battery, as a first storage ratio when an estimable condition which is a condition that enables to estimate the storage ratio is satisfied;
a second estimating step of monitoring whether or not the estimable condition which is a condition that enables to estimate the storage ratio is satisfied after the first storage ratio is estimated in the first estimating step, and when the estimable condition is satisfied, estimating the storage ratio of the rechargeable battery at that moment as a second storage ratio;
a full charge capacity correction step of estimating a full charge capacity value of the rechargeable battery based on a difference integrated value that is an integrated value integrated in the integrating step after the first storage ratio is estimated in the first estimating step and until the second storage ratio is estimated in the second estimating step and on a ratio of a difference between the first storage ratio and the second storage ratio to 1, and correcting the full charge capacity value by setting the estimated full charge capacity value as a new full charge capacity value;
an open circuit ratio estimating step of using, as the estimable condition, an open circuit voltage condition which requires a current flowing through the rechargeable battery to fall below an open circuit judgment value set in advance in order to judge that a state exists where an open circuit voltage can be obtained as a terminal voltage of the rechargeable battery, and when the open circuit voltage condition is satisfied, estimating the storage ratio of the rechargeable battery based on the terminal voltage of the rechargeable battery, wherein
the open circuit ratio estimating step is used as at least one of the first estimating step and the second estimating step.

* * * * *